(12) United States Patent
Mangal et al.

(10) Patent No.: US 12,278,722 B2
(45) Date of Patent: Apr. 15, 2025

(54) CIRCUITS AND METHODS FOR WAKE-UP RECEIVERS

(71) Applicant: The Trustees of Columbia University in the City of New York, New York, NY (US)

(72) Inventors: Vivek Mangal, Santa Clara, CA (US); Peter R. Kinget, Summit, NJ (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 18/383,797

(22) Filed: Oct. 25, 2023

(65) Prior Publication Data
US 2024/0073069 A1   Feb. 29, 2024

Related U.S. Application Data

(63) Continuation of application No. 17/419,138, filed as application No. PCT/US2020/012439 on Jan. 6, 2020, now abandoned.

(60) Provisional application No. 62/788,657, filed on Jan. 4, 2019.

(51) Int. Cl.
| | |
|---|---|
| *H04L 27/06* | (2006.01) |
| *H03K 19/0185* | (2006.01) |
| *H03K 19/17788* | (2020.01) |
| *H04L 27/26* | (2006.01) |

(52) U.S. Cl.
CPC ......... *H04L 27/06* (2013.01); *H03K 19/0185* (2013.01); *H03K 19/17788* (2013.01); *H04L 27/2617* (2013.01); *H04L 27/26412* (2021.01)

(58) Field of Classification Search
CPC ................ H04L 27/06; H04L 27/2617; H04L 27/26412; H03K 19/0185; H03K 19/17788; Y02D 30/70; H04W 52/0229
See application file for complete search history.

(56) References Cited

U.S. PATENT DOCUMENTS

| | | | |
|---|---|---|---|
| 6,163,185 A | * | 12/2000 | Deluigi ................ H03L 7/0891 327/156 |
| 8,340,623 B2 | | 12/2012 | Lu et al. |
| 8,526,884 B1 | | 9/2013 | Price et al. |
| 8,611,480 B1 | | 12/2013 | Lee et al. |

(Continued)

OTHER PUBLICATIONS

Machine translation of CN-200983589-Y. (Year: 2007).*

(Continued)

*Primary Examiner* — Jean B Corrielus
(74) *Attorney, Agent, or Firm* — Byrne Poh LLP

(57) ABSTRACT

Circuit for wake-up receivers are provide. In some embodiments, the wake-up receivers include self-mixers that receive a gate bias voltage. Some of the self-mixers are single ended and some are differential. In some embodiments, the wake-up receivers include a matching network that is connected to the input of the self-mixer. In some embodiments, the wake-up receivers include a low frequency path connected to the output of the self-mixer. In some embodiments, the wake-up receivers include a high frequency path connected to the output of the self-mixer. In some embodiments, the wake-up receivers are configured to receive an encoded bit stream. In some embodiments, the wake-up receivers are configured to wake-up another receiver.

21 Claims, 29 Drawing Sheets

(56) References Cited

U.S. PATENT DOCUMENTS

| | | | |
|---|---|---|---|
| 8,942,151 | B2 | 1/2015 | Anderson et al. |
| 9,191,891 | B2 | 11/2015 | Jafarian et al. |
| 9,413,403 | B2 | 8/2016 | Wentzloff et al. |
| 9,413,578 | B2 | 8/2016 | Rajagopal et al. |
| 9,736,779 | B2 | 8/2017 | Min et al. |
| 9,980,197 | B2 | 5/2018 | Zheng et al. |
| 2002/0186713 | A1* | 12/2002 | Brunel .................. H04B 1/04 370/344 |
| 2004/0198262 | A1 | 10/2004 | Ehrenreich |
| 2007/0098114 | A1* | 5/2007 | Hundhausen ........... H03J 7/02 375/326 |
| 2008/0096508 | A1* | 4/2008 | Luff .................... H03D 7/1433 455/209 |
| 2014/0031076 | A1 | 1/2014 | Tang et al. |
| 2014/0070625 | A1 | 3/2014 | Kim et al. |
| 2014/0085951 | A1 | 3/2014 | Kaeriyama |
| 2014/0254445 | A1 | 3/2014 | Heinzelman et al. |
| 2014/0112229 | A1 | 4/2014 | Merlin et al. |
| 2016/0315625 | A1 | 10/2016 | Bae et al. |
| 2019/0280725 | A1* | 9/2019 | Pister .................. H03K 3/0315 |
| 2020/0007310 | A1 | 1/2020 | Pavao Moreira |

OTHER PUBLICATIONS

Machine translation of CN-101908883-A. (Year: 2010).*
Machine translation of CN-104331004-A. (Year: 2015).*
Machine translation of CN-107135007-A. (Year: 2017).*
Machine translation of CN-1265785-A. (Year: 2000).*
Mangal et al., "An Ultra-Low-Power Wake-UP Receiver with Voltage-Multiplying Self-Mixer and Interferer-Enhanced Sensitivity", In Proceedings of the IEEE Custom Integrated Circuits Conference, Austin TX, US, Mangal et al., Apr. 30-May 3, 2017.*
Abe, T., et al., "An Ultra-Low-Power 2-Step Wake-Up Receiver for IEEE 802.15.4g Wireless Sensor Networks", In Proceedings of the Symposium on Very Long System Integration Circuits Digest of Technical Papers, Honolulu, HI, US, Jun. 10-13, 2014, pp. 1-2.
Baccour, N., et al., "Radio Link Quality Estimation in Wireless Sensor Networks: A Survey", In ACM Transactions on Sensor Networks, vol. 8, Sep. 2012, pp. 1-35.
Braun, W. R., "PN Acquisition and Tracking Performance in DS/CDMA Systems with Symbol-Length Spreading Sequences", In IEEE Transactions on Communications, vol. 45, Dec. 1997, pp. 1595-1601.
Chatterjee, S., et al., "0.5-V Analog Circuit Techniques and their Application in OTA and Filter Design", In IEEE Journal of Solid-State Circuits, vol. 40, No. 12, Dec. 5, 2005 pp. 2373-2387.
Gambini, S., et al., "Sensitivity Analysis for AM Detectors", Technical Report, Electrical Engineering and Computer Sciences University of California at Berkeley, Apr. 6, 2008, pp. 1-6.
Gantsog, E., et al., "A 12.46uW Baseband Timing Circuitry for Sychronization and Duty-Cycling of Scalable Wireless Mesh Networks in IoT", In RFIC, Jun. 2018, pp. 328-331.
Gorlatova, M., et al., "Energy-Harvesting Active Networked Tags (EnHANTs) for ubiquitous Object Networking", In IEEE Wireless Communications, vol. 17, No. 6, Dec. 23, 2010, pp. 18-25.
Hajimiri, A., et al., "A General Theory of Phase Noise in Electrical Oscillators", In IEEE Journal of Solid-State Circuits, vol. 33, No. 2, Feb. 1998, pp. 179-194.
Hajimiri, A., et al., "Jitter and Phase Noise in Ring Oscillators", In IEEE Journal of Solid-State Circuits, vol. 34, No. 6, Jun. 1999, pp. 790-804.
Hein, J. P., et al., "z-Domain Model for Discrete-Time PLL's", In IEEE Transactions on Circuits and Systems, vol. 35, No. 11, Nov. 1988, pp. 1393-1400.
Homayoun, A., and Razavi, B., "Relation between Delay Line Phase Noise and Ring Oscillator Phase Noise", In IEEE Journal of Solid-State Circuits, vol. 49, No. 2, Feb. 2014, pp. 384-391.
Hsieh, S., "A 0.4-V 13-bit 270-kS/s SAR-ISDM ADC With Opamp-Less Time-Domain Integrator", In IEEE Journal of Solid State Circuits, vol. 54, No. 6, Feb. 14, 2019, pp. 1648-1656.
Huang, X., et al., "Noise and Sensitivity in RF Envelope Detection Receivers", In IEEE Transactions on Circuits and Systems II: Express Briefs, vol. 60, No. 10, Aug. 29, 2013, pp. 637-641.
International Preliminary Report on Patentability dated Jul. 15, 2021 in International Patent Application No. PCT/US2020/012439, pp. 1-8.
International Search Report and Written Opinion dated May 1, 2020 in International Patent Application No. PCT/US2020/012439, pp. 1-30.
Jiang, H., et al., "A 4.5nW Wake-up Radio with -69dBm Sensitivity", In the Proceedings of the 2017 IEEE International Solid-State Circuits Conference, Feb. 5-9, 2017, pp. 416-418.
Magno, M., et al., "Design, Implementation, and Performance Evaluation of a Flexible Low-Latency Nanowatt Wake-Up Radio Receiver", In IEEE Transactions on Industrial Infomatics, vol. 12, No. 2, Apr. 2016, pp. 633-644.
Mandal, S., et al., "Low-Power CMOS Rectifier Design for RFID Applications", In IEEE Transactions on Circuits and Systems I: Regular Papers, vol. 54, No. 6, Jun. 11, 2007, pp. 1177-1188.
Mangal, V., et al., "Clock-Less Continuous-Time Analog Correlator Demonstrating Asynchronous CDMA for Wake-Up Receivers", In IEEE Radio Frequency Integrated Circuits Symposium, Jun. 2-4, 2019, pp. 1-10.
Mangal, V., and Kinget, P.R., "A 0.42nW 434MHz-79.1dBm Wake-Up Receiver with a Time-Domain Integrator", In 2019 IEEE International Solid-State Circuits Conference—(ISSCC), Feb. 2019, pp. 438-440.
Mangal, V., and Kinget, P.R., "Sub-nW Wake-Up Receivers with Gate-Biased Self-Mixers and Time-Encoded Signal Processing", In IEEE Journal of Solid-State Circuits, vol. 54, No. 67, Oct. 7, 2019, pp. 3513-3524.
Mangal, V., et al., "A -80.9dBm 450MHz Wake-Up Receiver with Code-Domain Matched Filtering using a Continuous-Time Analog Correlator", IEEE Radio Frequency Integrated Circuits Symposium, Jun. 2-4, 2019, pp. 259-262.
Mangal, V., et al., "A Wake-Up Receiver With a Multi-Stage Self-Mixer and With Enhanced Sensitivity When Using an Interferer as Local Oscillator", In IEEE Journal of Solid State Circuits, vol. 53, No. 3, Jan. 4, 2019, pp. 808-820.
McCormick, D. K., "IEEE Technology Report on Wake-Up Radio: An Application, Market, and Technology Impact Analysis of Low-Power/Low-Latency 802.11 Wireless LAN Interfaces", In Battery Life Improvement: IEEE Technology Report on Wake-Up Radio, Nov. 2017, pp. 1-56.
Moody, J., et al., "A -76dBm 7.4nW Wakeup Radio with Automatic Offset Compensation", In the Proceedings of the 2018 IEEE International Solid Sate Circuits Conference, Feb. 11-15, 2018, pp. 452-454.
Notice of Allowance dated Apr. 6, 2021 in U.S. Appl. No. 16/889,716, pp. 1-4.
Office Action dated Jul. 25, 2023 in U.S. Appl. No. 17/419,138, pp. 1-51.
Pandey, J., et al., "A 120µW MICS/ISM-band FSK Receiver with a 44µW Low-power Mode based on Injection-locking and 9x Frequency Multiplication", In 2011 IEEE International Solid-State Circuits Conference, San Francisco, CA, Feb. 20-24, 2011, pp. 460-462.
Patil, S., and Tsividis, Y., "Digital Processing of Signals Produced by Voltage-controlled-oscillator-based Continuous-time ADCs", In 2016 IEEE International Symposium on Circuits and Systems (ISCAS), May 2016, pp. 1046-1049.
Patil, S., et al., "Signal Encoding and Processing in Continuous Time Using a Cascade of Digital Delays", In IEEE Transactions on Circuits and Systems I: Regular Papers, vol. 66, Mar. 2019, pp. 1017-1030.
Pletcher, N. M., et al., "2GHz 52uW Wake-Up Receiver with -72dBm Sensitivity Using Uncertain-IF Architecture", In the 2008 IEEE International Solid-State Circuits Conference Digest of Technical Papers, San Francisco, CA, Feb. 3-7, 2008, pp. 524-633.
Rabaey, J. M., et al., "PicoRadios for Wireless Sensor Networks: the next challenge in ultra-low power design", In 2002 IEEE International Solid-State Circuits Conference, Digest of Technical Papers, San Francisco, CA, Feb. 7, 2002, pp. 200-201.

(56) References Cited

OTHER PUBLICATIONS

Rekhi, A. S., and Arbabian, A., "A 14.5mm2 8nW -59.7dBm-sensitivity Ultrasonic Wake-up Receiver for Power-, Area-, and Interference Constrained Applications", In IEEE International Solid State Circuits Conference, Feb. 2018, pp. 454-456.

Roberts, N., et al., "A 236nW -56.5dBm-Sensitivity Bluetooth Low-Energy Wakeup Receiver with Energy Harvesting in 65nm CMOS", In Proceedings of the International Solid-State Circuits Conference Digest Technical Papers, Feb. 2016, pp. 450-451.

Sadagopan, K.R., et al., "A 365nW -61.5 dBm Sensitivity, 1.875 cm2 2.4 GHz Wake-up Receiver with Rectifier-antenna Co-design for Passive Gain", In the Proceedings of the Radio Frequency Integrated Circuits Symposium, Jun. 2017, pp. 1-4.

Salazar, C., et al., "A -97dBm-sensitivity Interferer-resilient 2.4GHz Wake-up Receiver using Dual-IF Multi-N-Path Architecture in 65nm CMOS", In the Proceedings of the International Solid-State Circuits Conference, Feb. 2015, pp. 242-244.

Schell, B., et al., "A Continuous-Time ADC/DSP/DAC System With No Clock With Activity-Dependent Power Dissipation", In Journal of Solid State Circuits, vol. 43, No. 11, Nov. 2008, pp. 2472-2481.

Schlegel, C., et al., "Coded Asynchronous CDMA and its Efficient Detection", In IEEE Transactions on Information Theory, vol. 44, Nov. 1998, pp. 2837-2847.

Schulz, P., et al., "Latency Critical IoT Applications in 5G: Perspective on the Design of Radio Interface and Network Architecture", In IEEE Communications Magazine, vol. 55, No. 2, Feb. 3, 2017, pp. 70-78.

Senderowicz, D., et al., "A 23mW 256-tap 8 MSample/s QPSK Matched Filter for DS-CDMA Cellular Telephony using Recycling Integrator Correlators", In ISSCC, Feb. 2000, pp. 354-355.

Shibano, T., et al., "Matched Filter for DS-CDMA of up to 50 MChip/s based on Sample Analog Signal Processing", In ISCC, San Francisco, CA, Feb. 1997, pp. 100-101.

Stoopman, M., et al., "Co-Design of a CMOS Rectifier and Small Loop Antenna for Highly Sensitive RF Energy Harvesters", In IEEE Journal of Solid-State Circuits, vol. 49, No. 3, Feb. 13, 2014, pp. 622-634.

Ulukus, S., and Yates, R.D., "User Capacity of Asynchronous CDMA Systems with Matched Filter Receivers and Optimum Signature Sequences", In IEEE Transactions on Information Theory, vol. 50, May 2004, pp. 903-909.

Umeda, T., "A 950-MHz Rectifier Circuit for Sensor Network Tags with 10-m Distance", In IEEE Journal of Solid-State Circuits, vol. 41, No. 1, Dec. 27, 2005, pp. 35-41.

Vigraham, B., et al., "Switched-Mode Operational Amplifiers and Their Application to Continuous-Time Filters in Nanoscale CMOS", In IEEE Journal of Solid-State Circuits, vol. 49, Dec. 2014, pp. 2758-2772.

Wang, P., et al., "A 400 MHz 4.5 nW -63.8 dBm Sensitivity Wake-up Receiver Employing an Active Pseudo-balun Envelope Detector", In Proceedings of 43rd IEEE European Solid State Circuits Conference, Leuven, Belgium, Sep. 11-14, 2017, pp. 35-38.

Wang, P., et al., "A Near-Zero-Power Wake-Up Receiver Achieving -69-dBm Sensitivity", In IEEE Journal of Solid-State Circuits, vol. 53, No. 6, Apr. 19, 2018, pp. 1640-1652.

Wang, P., et al., "A 6.1-nW Wake-Up Receiver Achieving -80.5-dBm Sensitivity Via a Passive Pseudo-Balun Envelope Detector", In IEEE Solid-State Circuits Letters, vol. 1, No. 5, May 2018, pp. 134-137.

Woodward, G., and Vucetic, B.S., "Adaptive Detection for DS-CDMA", In Proceedings of the IEEE, vol. 86, Jul. 1998, pp. 1413-1434.

Yadav, K., et al., "A 4.4uW Wake-up Receiver using Ultrasound Data Communications", In 2011 Symposium on VLSI Circuits Digest of Technical Papers, Honolulu, HI, Jun. 15-17, 2011, pp. 212-213.

Ye, D., et al., "A 915 MHz 175 µW Receiver Using Transmitted-Reference and Shifted Limiters for 50 dB In-Band Interference Tolerance", In IEEE Journal of Solid-State Circuits, vol. 51, No. 12, Sep. 21, 2016, pp. 3114-3124.

Ye, D., et al., "An Ultra-Low-Power Receiver using Transmitted-reference and Shifted Limiters for In-band Interference Resilience", In 2016 IEEE International Solid-State Circuits Conference, San Francisco, CA, Jan. 31-Feb. 4, 2016, pp. 438-439.

Yoon, D.,et al., "A New Approach to Low-Power and Low-Latency Wake-Up Receiver System for Wireless Sensor Nodes", In IEEE Journal of Solid-State Circuits, vol. 47, No. 10, Aug. 28, 2012, pp. 2405-2419.

* cited by examiner

CIRCUITS AND METHODS FOR WAKE-UP RECEIVERS

CROSS REFERENCE TO RELATED APPLICATION

This application is a continuation of U.S. patent application Ser. No. 17/419,138, filed Jun. 28, 2021, which was abandoned as of Oct. 25, 2023, which is a U.S. National Stage Entry under 35 U.S.C. § 371 of International Application No. PCT/US2020/012439, filed Jan. 6, 2020, which claims the benefit on U.S. Provisional Patent Application No. 62/788,657, filed Jan. 4, 2019, each of which is hereby incorporated by reference herein in its entirety.

STATEMENT REGARDING GOVERNMENT FUNDED RESEARCH

This invention was made with government support under 1309721 awarded by the National Science Foundation. The government has certain rights in the invention.

BACKGROUND

In many energy-limited wireless communications applications, it is desirable for receivers to operate in a deep sleep mode when inactive to prolong lifetime on available power (e.g., such as power stored in a connected battery or other power source (e.g., a capacitor)).

One technique that can be used to enable the receivers to timely receive asynchronous communications is to use a first always ON (or almost always ON) (when in deep sleep mode) low-power receiver to receive a wake-up signal and, in response, turn ON a second main receiver. Such first receivers can be referred to herein as wake-up receivers.

Accordingly, new mechanisms for wake-up receivers are desirable.

SUMMARY

In accordance with some embodiments, circuits and methods for wake-up receivers are provided. In some embodiments, circuits for wake-up receivers are provided, the circuits comprising: a first self-mixer stage comprising: a first NMOS transistor having a source, a drain, and a gate; a second NMOS transistor having a source, a drain, and a gate, wherein the drain of the second NMOS transistor is connected to the drain of the first NMOS transistor; a first PMOS transistor having a source, a drain, and a gate, wherein the source of the first PMOS transistor is connected to the source of the first NMOS transistor; a second PMOS transistor having a source, a drain, and a gate, wherein the drain of the second PMOS transistor is connected to the drain of the first PMOS transistor, and the source of the second PMOS transistor is connected to the source of the second NMOS transistor; a first resistor having a first side connected to the gate of the first NMOS transistor and having a second side connected to a first gate bias voltage; a second resistor having a first side connected to the gate of the first PMOS transistor and having a second side connected to a second gate bias voltage; a third resistor having a first side connected to the gate of the second NMOS transistor and having a second side connected to the first gate bias voltage; a fourth resistor having a first side connected to the gate of the second PMOS transistor and having a second side connected to the second gate bias voltage; a first coupling capacitor having a first side connected to a first radio frequency (RF) input signal and having a second side connected to the gate of the first NMOS transistor; a second coupling capacitor having a first side connected to the first RF input signal and having a second side connected to the gate of the first PMOS transistor; a third coupling capacitor having a first side connected to a second RF input signal and having a second side connected to the gate of the second NMOS transistor; and a fourth coupling capacitor having a first side connected to the second RF input signal and having a second side connected to the gate of the second PMOS transistor.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements.

DETAILED DESCRIPTION

Figure 1:
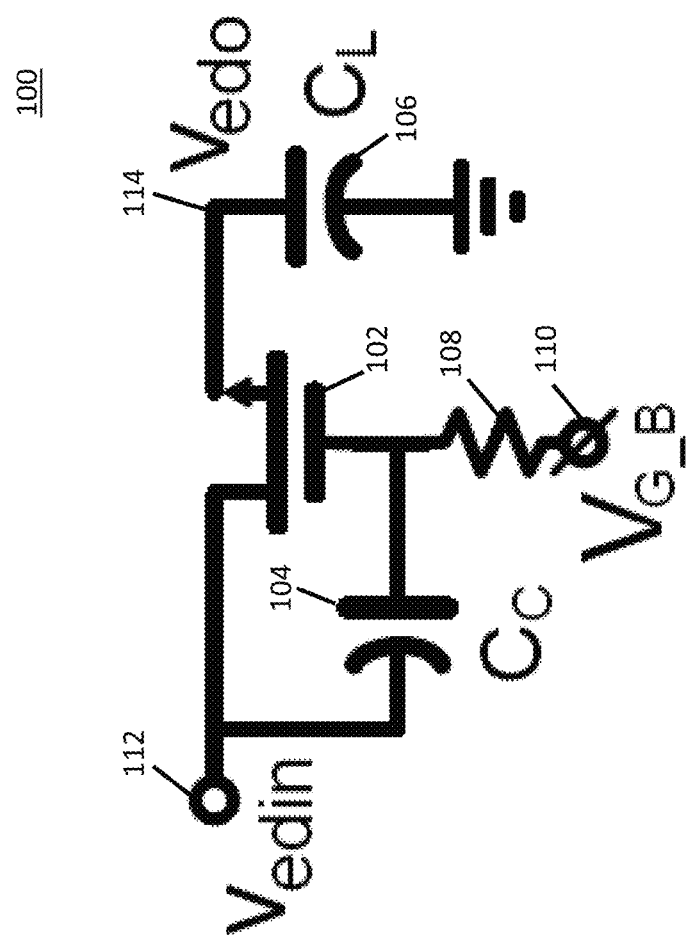
FIG. 1 is an example of a single transistor self-mixer in accordance with some embodiments.

As shown in FIG. 1, in accordance with some embodiments, a gate-biased self-mixer 100 is provided. As illustrated, self-mixer 100 includes an NMOS FET 102, an AC coupling capacitor $C_C$ 104, a load capacitor $C_L$ 106, and a bias resistor 108 in some embodiments.

During operation, in some embodiments, a DC gate bias potential, $V_{G\_B}$, is provided at the gate of NMOS FET 100 via resistor 108 from terminal 110. This gate bias potential slightly forward biases the channel of NMOS FET 100, while still operating the transistor in the weak-inversion, linear region in some embodiments. The input signal, $V_{edin}$, is provided to self-mixer 100 at terminal 112, and an output signal, $V_{edo}$, is sensed from self-mixer 100 at terminal 114, in some embodiments.

Figure 2A:
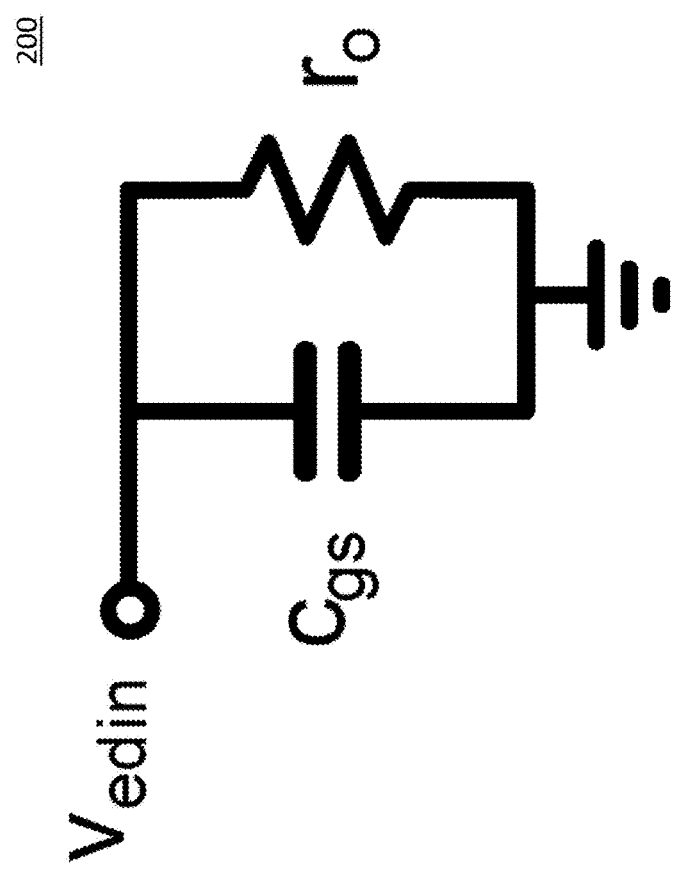
FIG. 2A is an example of an equivalent small-signal model of the circuit in FIG. 1 at an RF input frequency in accordance with some embodiments.

FIG. 2A shows an example equivalent small-signal model 200 of the circuit in FIG. 1 at an RF input frequency, assuming capacitors $C_C$ 104 and $C_L$ 106 are sufficiently large to act as shorts at the operating radio frequency (RF).

Figure 2B:
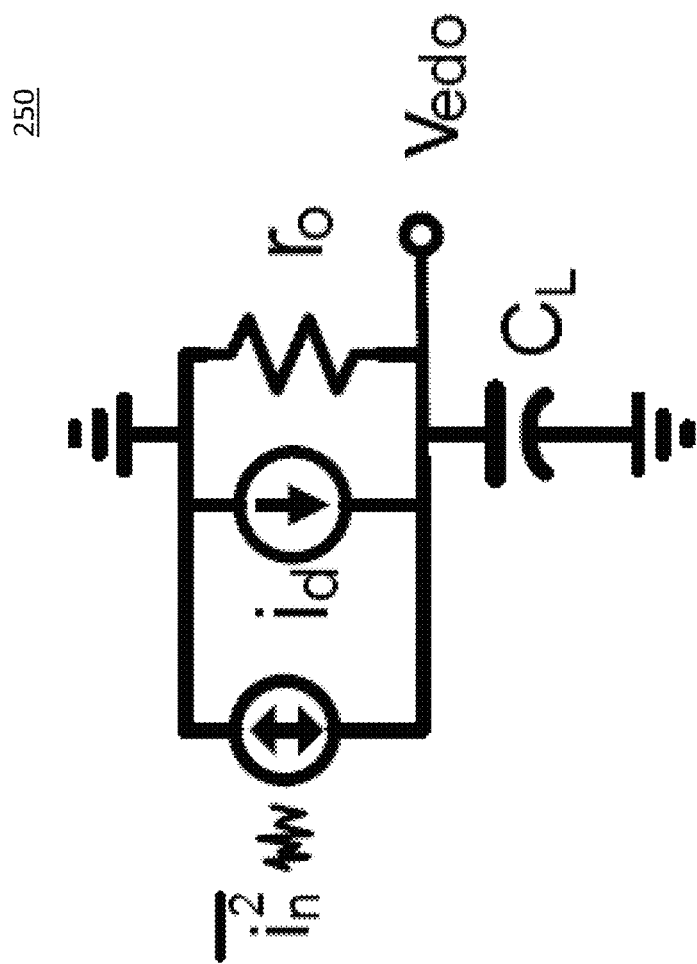
FIG. 2B is an example of an equivalent small-signal model of the circuit in FIG. 1 at a baseband frequency in accordance with some embodiments.

FIG. 2B shows an example equivalent small-signal model 250 of the circuit in FIG. 1 at a baseband frequency, assuming capacitors $C_C$ 104 and $C_L$ 106 are sufficiently small to act as opens at the baseband frequency.

In some embodiments, self-mixer 100 (and other self-mixers as described herein) can be used to implement an energy detector.

Figure 3:
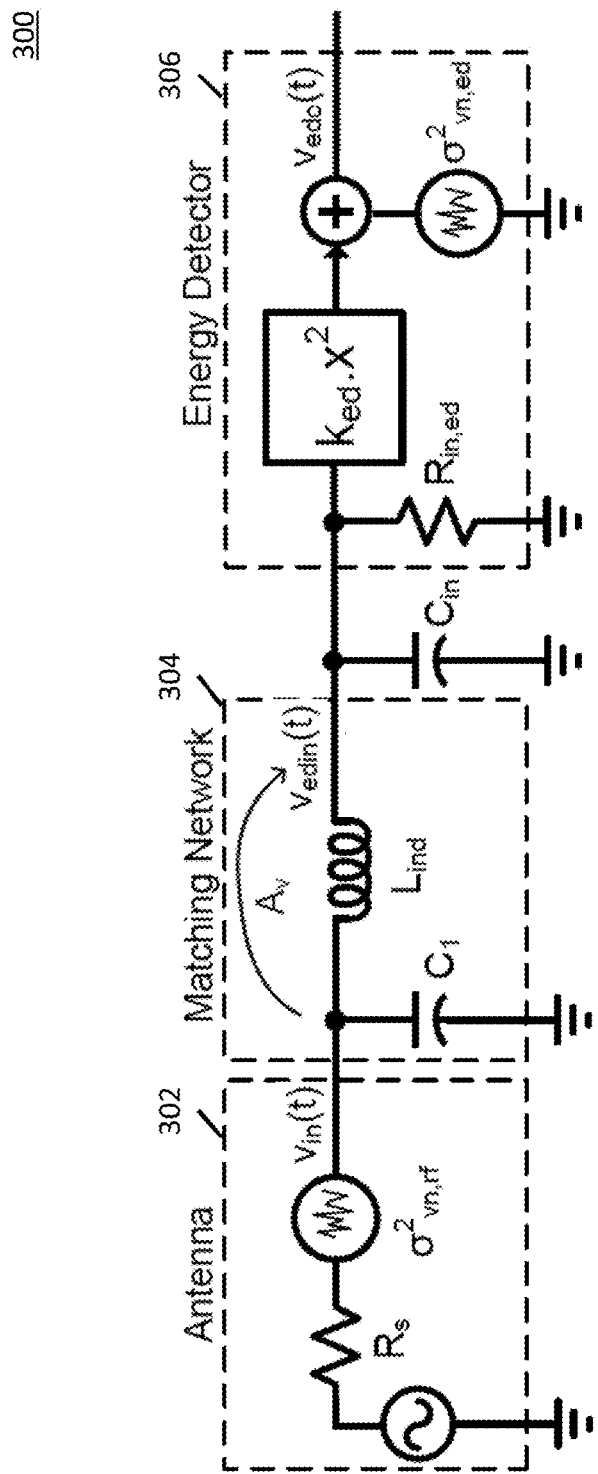
FIG. 3 is an example of a small signal model for ideal wake-up receiver front end in accordance with some embodiments.

FIG. 3 shows an example 300 of a small signal model for ideal receiver front end including an antenna 302, a matching network 304, and an energy detector 306. In this figure, antenna 302 is represented as a voltage source with a source resistance $R_S$ of 500Ω and is matched to energy detector 306 using matching network 304, which has a passive gain $A_v$ at frequency $f_{rf}$. Energy detector 306 has an input resistance $R_{in,ed}$, an input capacitance $C_{in}$, and a conversion gain constant $k_{ed}$. The passive gain $A_v$ of the matching network causes $V_{edin}$ to equal $V_{in}A_v$. The passive gain $A_v$ from matching network 304 at an angular frequency $\omega_{RF}=2\pi f_{rf}$ can be written as:

$$A_v = \sqrt{\frac{R_{in,ed}}{R_s}} \bigg/ \sqrt{\left(1 + \frac{\omega_{RF} R_{in,ed} C_{in}}{Q_{ind}}\right)}$$

wherein $Q_{ind}$ is the quality factor of inductance $L_{ind}$ of matching network 304. As can be seen from this equation, reducing the size of $C_{in}$ can be used to increase the size of $A_v$, in some embodiments. Thus, a minimal $C_{in}$ may be desirable in some embodiments.

In some embodiments, it is desirable to provide an input resistance $R_{in,ed}$ having a given value $R_{in,opt}$ that optimizes the sensitivity of energy detector 306. In some embodiments, $R_{in,opt}$ can be calculated as follows: $R_{in,opt}=Q_{ind}/\omega_{RF}C_{in}$. For example, for a $Q_{ind}$ of 80, and a $C_{in}$ of 1 pF at a $\omega_{RF}$ of 434 MHz, $R_{in,opt}$ (and thus $R_{in,ed}$) can have a value of 30 kΩ, in some embodiments.

In some embodiments, the input capacitance $C_{in}$ for self-mixer 100 may be dominated by the gate-to-source capacitance $c_{gs}$ of transistor 102. Using a minimum-sized transistor for transistor 102 can keep $C_{in}$ low. For example, in some embodiments, a transistor with a width W of 1 μm and a length of 60 nm may only contribute a capacitance of 1 fF.

Figure 4:
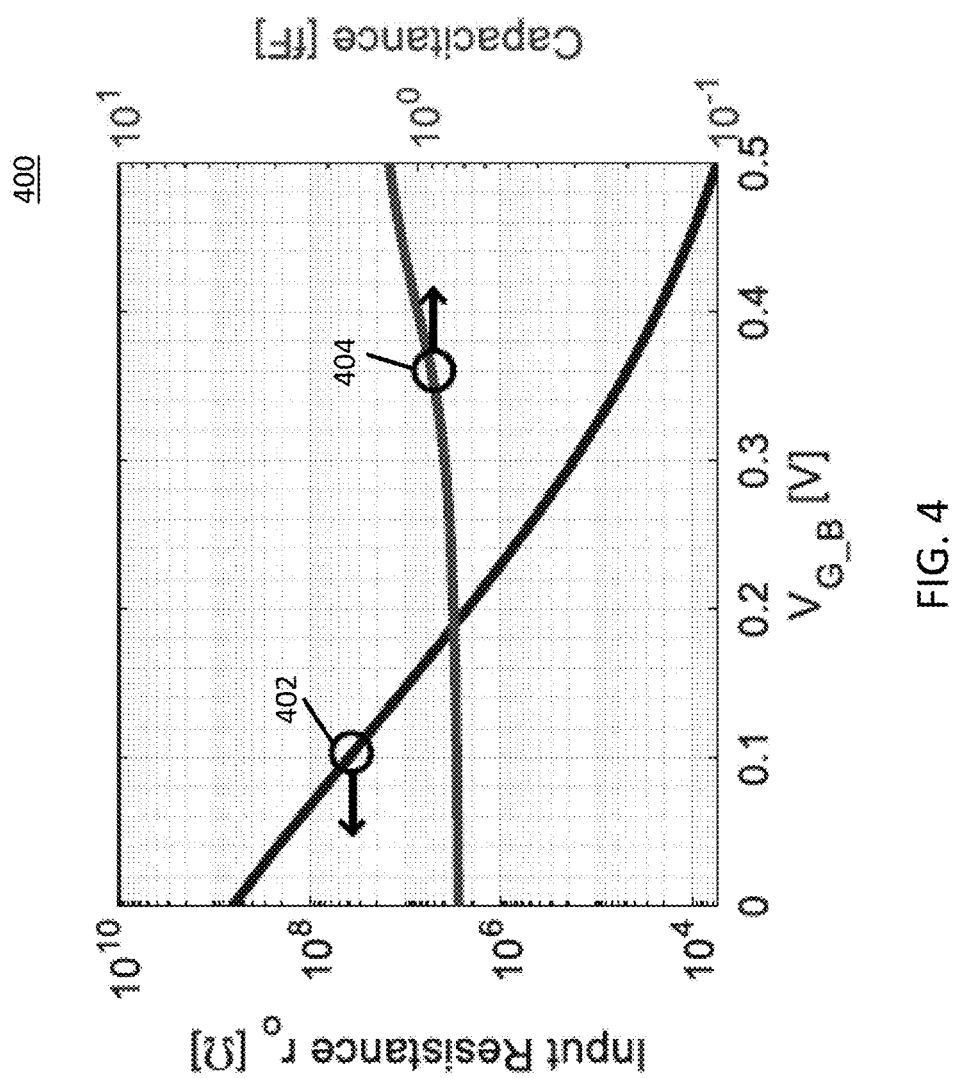
FIG. 4 is an example of a graph showing that the input resistance $R_{in,ed}$ and input capacitance $C_{in,ed}$ of a self-mixer can be changed by changing $V_{G\_B}$ in accordance with some embodiments.

As shown in FIG. 4, an example of a graph 400 showing that the input resistance $R_{in,ed}$ (or $r_o$ as shown in FIG. 2) (shown by line 402) and input capacitance $C_{in,ed}$ (which may be dominated by $c_{gs}$ as described above) (shown by line 404) of self-mixer 100 can be changed by changing $V_{G\_B}$, in accordance with some embodiments. The particular values shown in FIG. 4 are for an example one-stage self-mixer including a single transistor with a channel width (W) of 1 μm and a channel length (L) of 60 nm in a 65 nm LP CMOS process. Other values may be realized in some embodiments. In some embodiments, $R_{in,ed}$ can be a function of various parameters as follows:

$$R_{in,ed} = r_o = \frac{V_t}{K} = \frac{V_t}{I_s}\frac{L}{W}e^{-V_{G\_B}/(nV_t)}$$

wherein $V_t$ (which is equal to $k_BT/q$) is the thermal voltage of transistor 102, $k_B$ is the Boltzmann constant, T is absolute temperature of transistor 102, q is elementary charge, K equals $I_S(W/L)$, $I_S$ is the saturation current of transistor 102, and n is the subthreshold-slope coefficient.

Figure 5:
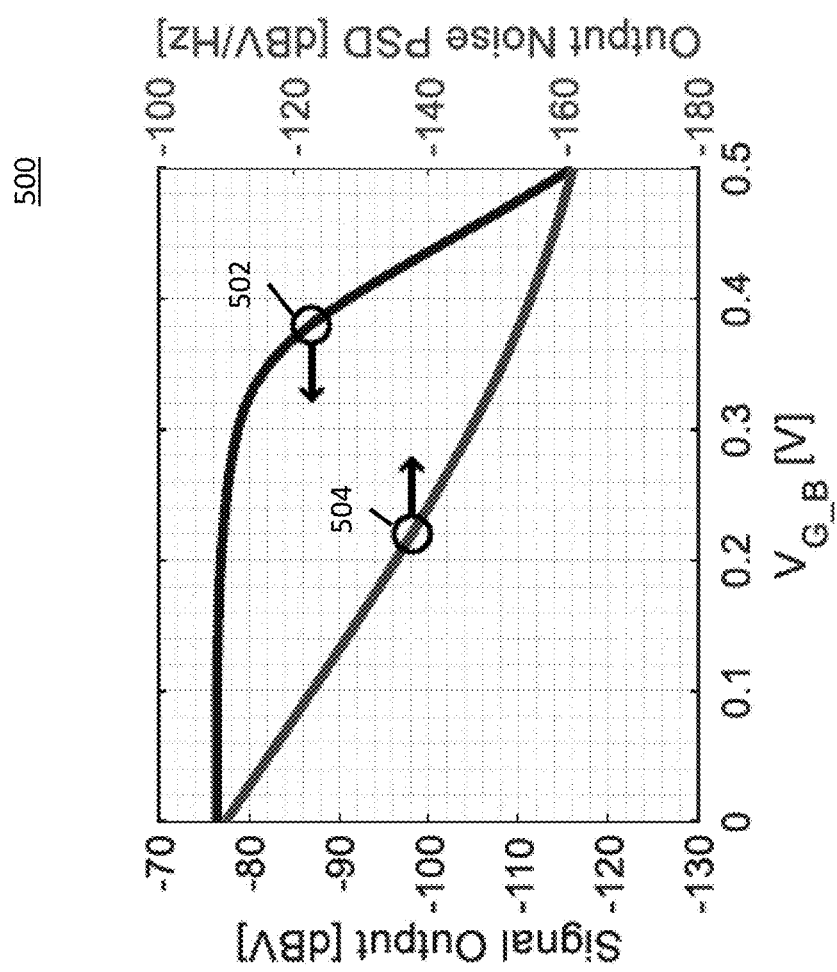
FIG. 5 is an example of a graph showing that varying $V_{G\_B}$ between 0.0 VDC and 0.3 VDC results in almost the same output from a self-mixer in accordance with some embodiments.

Turning to FIG. 5, an example of a graph 500 showing that varying $V_{G\_B}$ between 0.0 VDC and 0.3 VDC results in almost the same output (for a 5 mV peak RF input) (as shown by line 502) from self-mixer 100. Thus, $V_{G\_B}$ can be varied in this range to change the input resistance $R_{edin}$ of self-mixer 100 (as shown by line 402 of FIG. 4) without changing the input capacitance ($C_{in}$) or gain of self-mixer 100 (as shown by line 504 of FIG. 5), in some embodiments.

Since the transistor is operating in the weak-inversion, linear region between 0.0 VDC and 0.3 VDC, the power spectral density (PSD) of the output noise of the self-mixer can be written as $4k_B TR_{out,ed}$, where $R_{out,ed}$ is equal to the channel resistance $r_o$ for a one-stage self-mixer, such as self-mixer 100. FIG. 5 also shows an exponential drop in PSD at 100 Hz for self-mixer 100 with increasing $V_{G\_B}$, demonstrating the direct dependence of PSD on the channel resistance $r_o$.

Therefore, by increasing $V_{G\_B}$ within the weak-inversion, linear region, the self-mixer noise contribution at baseband can be reduced while keeping the conversion gain constant (or nearly constant) and the input capacitance low in order to maximize the signal-to-noise ratio (SNR) at the output of the self-mixer.

In some embodiments, further sensitivity enhancement can be achieved by increasing the conversion gain constant $k_{ed}$ for the self-mixer.

Figure 6A:
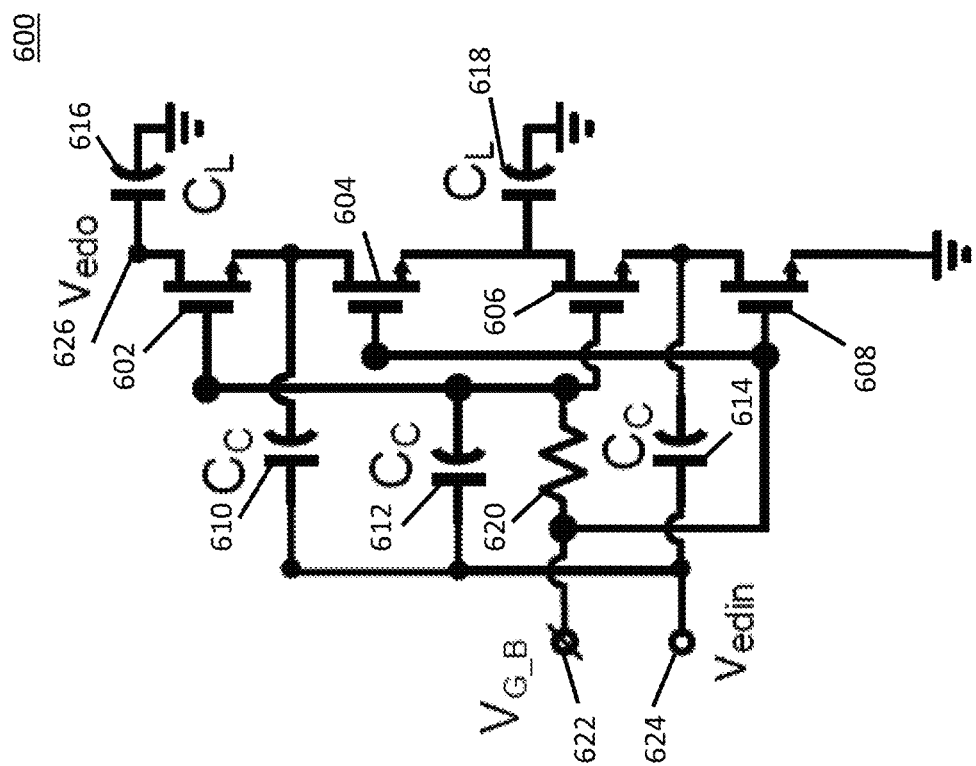
FIG. 6A is an example of a single-ended multi-transistor self-mixer in accordance with some embodiments.

Turning to FIG. 6A, an example 600 of a single-ended multi-transistor self-mixer in accordance with some embodiments is illustrated. As shown, self-mixer 600 includes NMOS FETs 602, 604, 606, and 608, coupling capacitors 610, 612, and 614, load capacitors 616 and 618, and a bias resistor 620.

Like self-mixer 100, during operation, a gate bias potential $V_{G\_B}$ is provided to the gates of each of transistors 602, 604, 606, and 608 via terminal 622 and resistor 620 (transistors 602 and 606 only). An input signal $V_{edin}$ is provided to self-mixer 600 at terminal 624 and an output signal $V_{edo}$ is sensed from self-mixer 600 at terminal 626.

In accordance with some embodiments, transistors 602, 604, 606, and 608 of self-mixer 600 form a cascade of transistors each operating in one of two different configurations. More particularly, in some embodiments: transistors 604 and 608 operate in a first configuration in which an RF signal $V_{edin}$ is AC coupled at the drains of the transistors; and transistors 602 and 606 operate in a second configuration in which the RF signal $V_{edin}$ is AC coupled at the sources and the gates of the transistors 602 and 606.

Figure 6C:
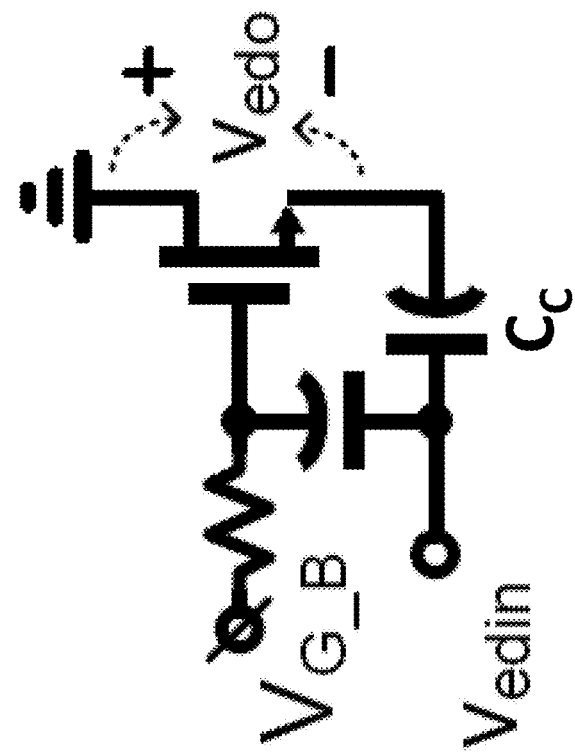
FIG. 6C is an example of the operation of a transistor of the single-ended multi-transistor self-mixer of FIG. 6A when in a second configuration in accordance with some embodiments.
Figure 6B:
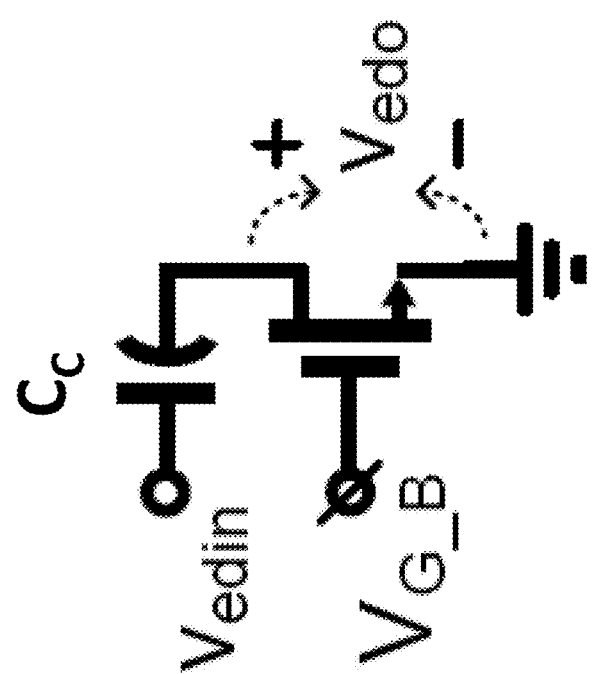
FIG. 6B is an example of the operation of a transistor of the single-ended multi-transistor self-mixer of FIG. 6A when in a first configuration in accordance with some embodiments.

When transistors 604 and 608 are operating in the first configuration, they operate as shown in FIG. 6B in some embodiments. More particularly, in some embodiments, assuming a baseband drain-to-source potential generated as $V_{edo}$: $V_{gb}=V_{G\_B}$; $V_{sb}=0$; and $V_{db}=V_{edin}+V_{edo}$, and assuming coupling capacitor Cc is open at baseband, equating the baseband current to zero gives:

$$V_{edo} = \frac{(V_{edin})^2}{2V_t} = k_{ed1}(V_{edin})^2$$

When transistors 602 and 606 are operating in the second configuration, they operate as shown in FIG. 6C in some embodiments. More particularly, in some embodiments, assuming a baseband drain-to-source potential generated as $V_{edo}$: $V_{gb}=V_{G\_B}+V_{edin}$; $V_{sb}=V_{edin}-V_{edo}$; and $V_{db}=0$, and assuming coupling capacitor Cc is open at baseband, equating the baseband current to zero gives:

$$V_{edo,1t} = \frac{(2-n)(V_{edin})^2}{2nV_t} = k_{ed1}(V_{edin})^2$$

When the transistors in these two configurations are cascaded to form a multistage self-mixer as shown in FIG. 6A, on average, the output of each stage at baseband can be written as:

$$V_{edo} = \frac{V_{edin}^2}{2nV_t}$$

Figure 7B:
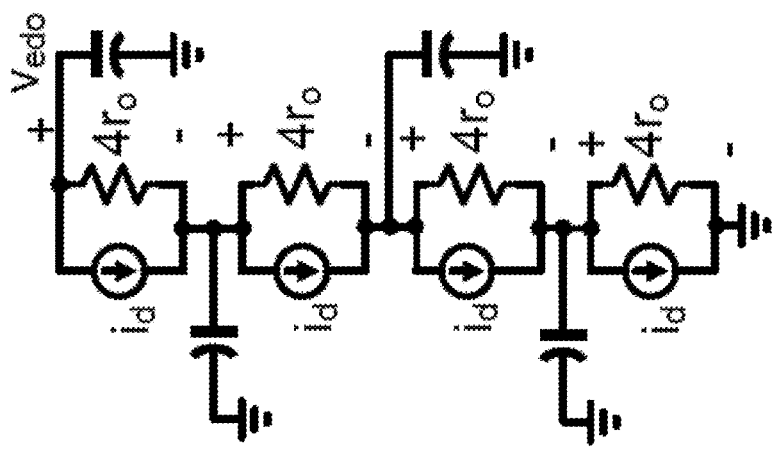
FIG. 7B is an example of a small-signal models at baseband frequency of the circuit in FIG. 6A in accordance with some embodiments.
Figure 7A:
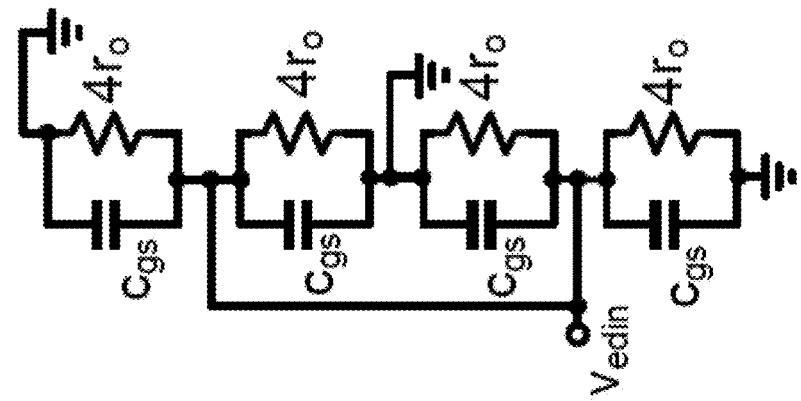
FIG. 7A is an example of a small-signal model at RF of the circuit in FIG. 6A in accordance with some embodiments.

FIGS. 7A and 7B show examples of small-signal models at RF and baseband frequency, respectively, of the circuit in FIG. 6A, in accordance with some embodiments.

As shown in FIG. 7A, multiple stages appear in parallel at RF, thus the input resistance of the 4-stage self-mixer of FIG. 6A at RF is $4r_o/4$ or $r_o$.

As shown in FIG. 7B, the model does not have multi-stage closed loops at baseband, therefore the loading is capacitive. For N-stages the baseband output is:

$$v_{edo} = k_{ed}v_{edin}^2 = N\frac{(v_{edin})^2}{2nV_t}$$

where the conversion constant $k_{ed}$ is $N/(2nV_t)$. Multiple stages appear in series at baseband, thus the output resistance is $N \cdot r_o$; therefore $R_{out,ed}$ equals $N^2 R_{in,ed}$. The output noise PSD in the signal bandwidth of interest is then $PSD_{vn,ed}$ equals $4k_B TN^2 R_{in,ed}$.

Figure 8:
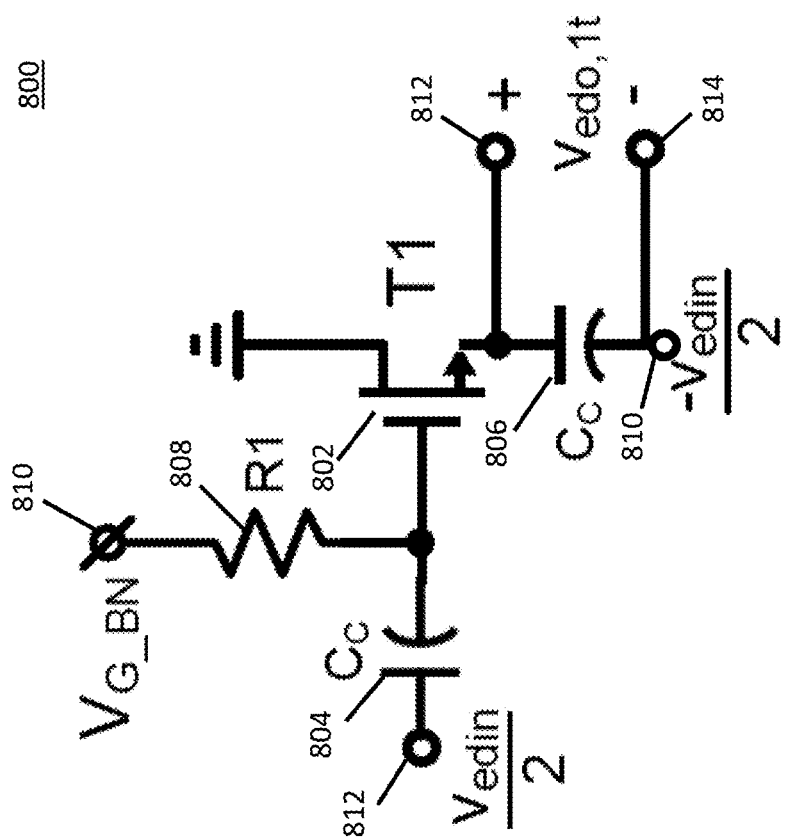
FIG. 8 is an example of a one-transistor, differential self-mixer in accordance with some embodiments.

Turning to FIG. 8, an example 800 of a one-transistor, differential self-mixer in accordance with some embodiments is shown. As illustrated, self-mixer 800 includes NMOS FET T1 802, coupling capacitors $C_C$ 804 and 806, and bias resistor R1 808.

In some embodiments, during operation of one-transistor, differential self-mixer 800: the drain of T1 is grounded; the coupling capacitors $C_C$ are assumed to act as shorts at RF and opens at baseband; the source is floating (so the source has the same DC potential as the drain); the DC bias at the gate of T1 is $V_{G\_BN}$; and RF signals $V_{rf}=V_{edin}/2$ and $-V_{rf}=-V_{edin}/2$ are AC coupled to the gate and the source of T1, respectively.

Assuming that the baseband signal generated across drain and source due to second-order non-linearity is small, $V_{gb}=V_{G\_B}+V_{rf}$, $V_{sb}=V_{edo,1t}-V_{rf}$, and $V_{db}=0$ in some embodiments. For small $V_{rf}$, using the Taylor series expansion and neglecting higher order terms:

$$I_{ds} = K\left(\frac{v_{rf}-V_{edo,1t}}{V_t}\right) + K\left(\frac{v_{rf}}{V_t}\right)^2\left[\frac{2+n}{2n}\right]$$ where:

$$K = I_s(W/L)e^{V_{G\_BN}/(nV_t)}.$$

Figure 9:
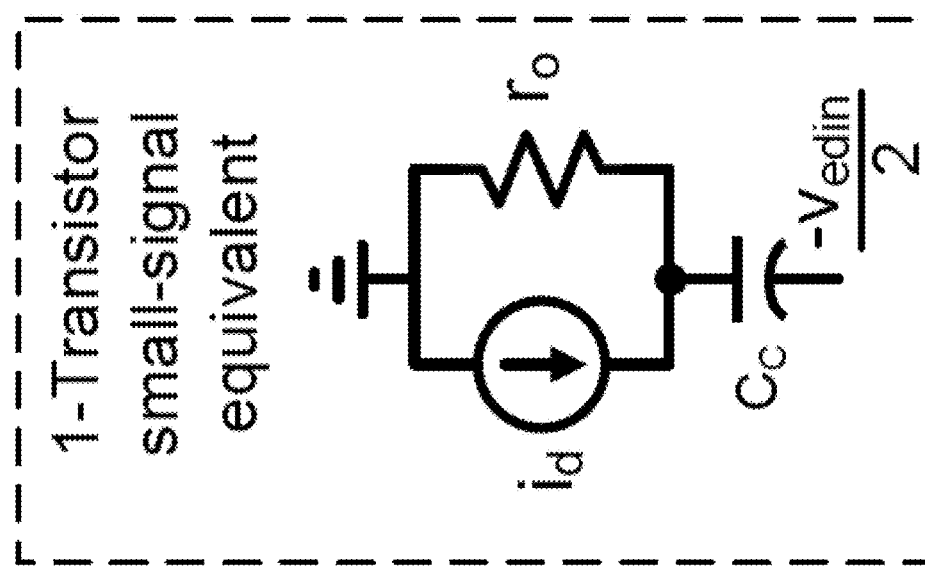
FIG. 9 is an example of an equivalent small-signal model at baseband of the circuit of FIG. 8 in accordance with some embodiments.

This leads to the equivalent small-signal model at baseband shown in FIG. 9. The first term is proportional to the drain-to-source potential $V_{db}-V_{sb}$ and can be represented as a resistor $r_o$ as follows:

$$r_0 = \frac{V_t}{K} = \frac{V_t}{I_s}\frac{L}{W}e^{-V_{G\_BN}/(nV_t)}$$

The second term can be represented as an $i_{ds}$ current source:

$$V_{edo,1r} = i_{ds}r_0 = \left[\frac{2+n}{2n}\right]\frac{(v_{rf})^2}{V_t} = k_{ed1}(v_{rf})^2$$

Figure 10:
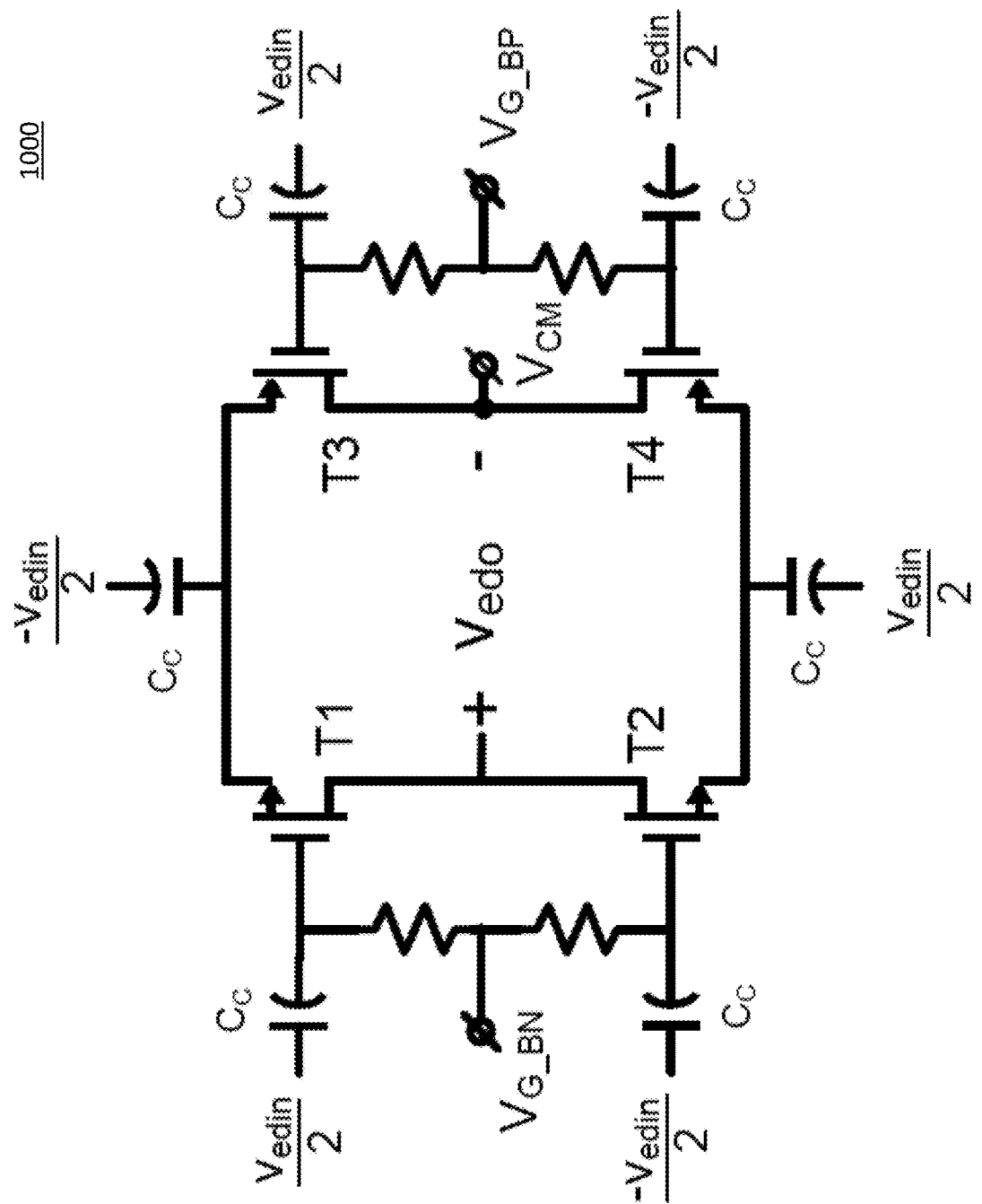
FIG. 10 is an example of a complete stage of a differential self-mixer combining a PMOS transistor pair and an NMOS transistor pair in accordance with some embodiments.

FIG. 10 shows an example 1000 of a complete stage of a differential self-mixer combining a PMOS transistor pair (T3, T4) and an NMOS transistor pair (T1, T2) in accordance with some embodiments. A common-mode voltage $V_{CM}$ is provided at the drains of T3 and T4. The corresponding gate bias voltage for PMOS transistors T3 and T4 is $V_{G\_BP}$. In the presence of an RF signal, a drain-to-source potential is generated across all transistors. Because the current polarities for PMOS transistors and NMOS transistors are opposite, the voltages across T3 and T1 get added and the observed output potential across 1-stage at baseband can be written as:

$$v_{out} = k_{ed}v_{edin}^2 = N\left[\frac{2+n}{4n}\right]\frac{(v_{edin})^2}{V_t}$$

Figure 11:
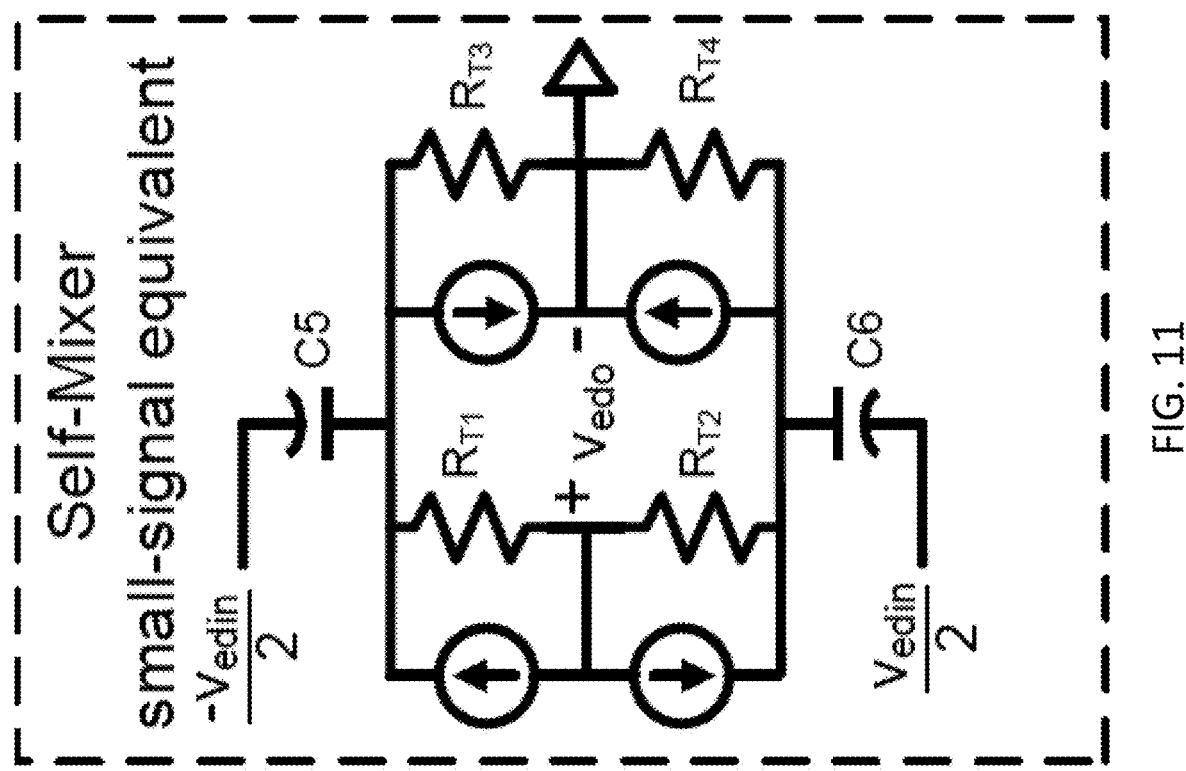
FIG. 11 is an example of a small-signal equivalent model of the circuit in FIG. 10 in accordance with some embodiments.

FIG. 11 illustrates and example of a small-signal equivalent model of the circuit in FIG. 10 in accordance with some embodiments.

The self-mixer stages of FIG. 10 can be cascaded into a differential multi-stage self-mixer, in some embodiments. For example, in some embodiments, a differential multi-stage self-mixer can be implemented as shown in FIG. 12.

Figure 12:
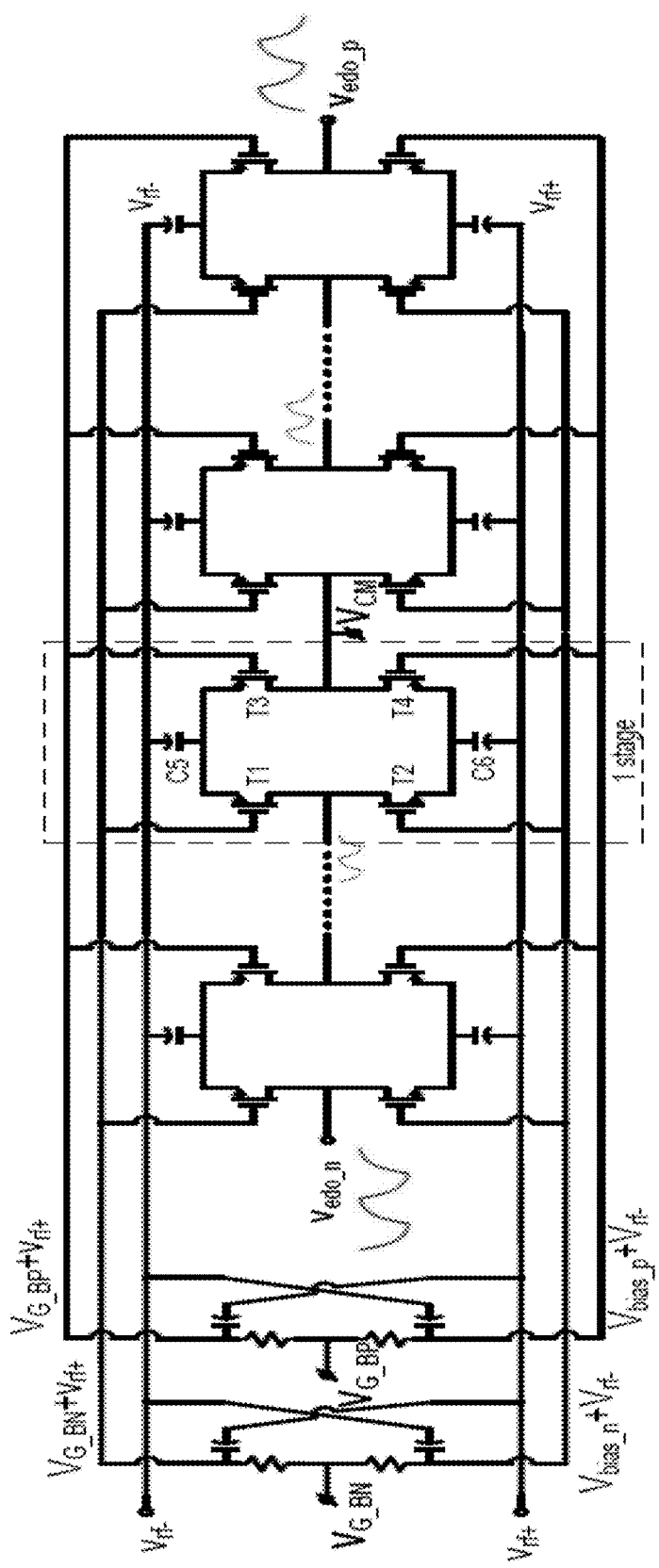
FIG. 12 is an example of a differential multi-stage self-mixer in accordance with some embodiments.

In some embodiments, the cascading stages in FIG. 12 are configured to not form any closed loops, hence the load created by the stages is capacitive. A common-mode potential $V_{CM}$ can be provided at the drain of the middle stage in FIG. 12 in some embodiments. For N-stages, the conversion equation for self-mixer be represented as follows in some embodiments:

$$v_{out} = k_{ed}v_{edin}^2 = N\left[\frac{2+n}{4n}\right]\frac{(v_{edin})^2}{V_t},$$

and the conversion constant $k_{ed}$ for the N-stage self-mixer can represented as follows in some embodiments: $N(2+n)/4nV_t$.

The N stages appear in parallel at RF and in series at baseband in some embodiments. Hence, the differential input resistance at RF is $R_{in}=r_o/N$, while the differential output resistance at baseband is $R_{out}=Nr_o$, and thus $R_{out}=N^2R_{in}$. The output noise variance of the self-mixer is then:

$$\sigma_{vn,ed}^2 = 4K_BTN^2R_{in}BW_{BB},$$

wherein $K_B$ is the Boltzmann constant and $BW_{BB}$ is the baseband bandwidth of the input signal.

Figure 13:
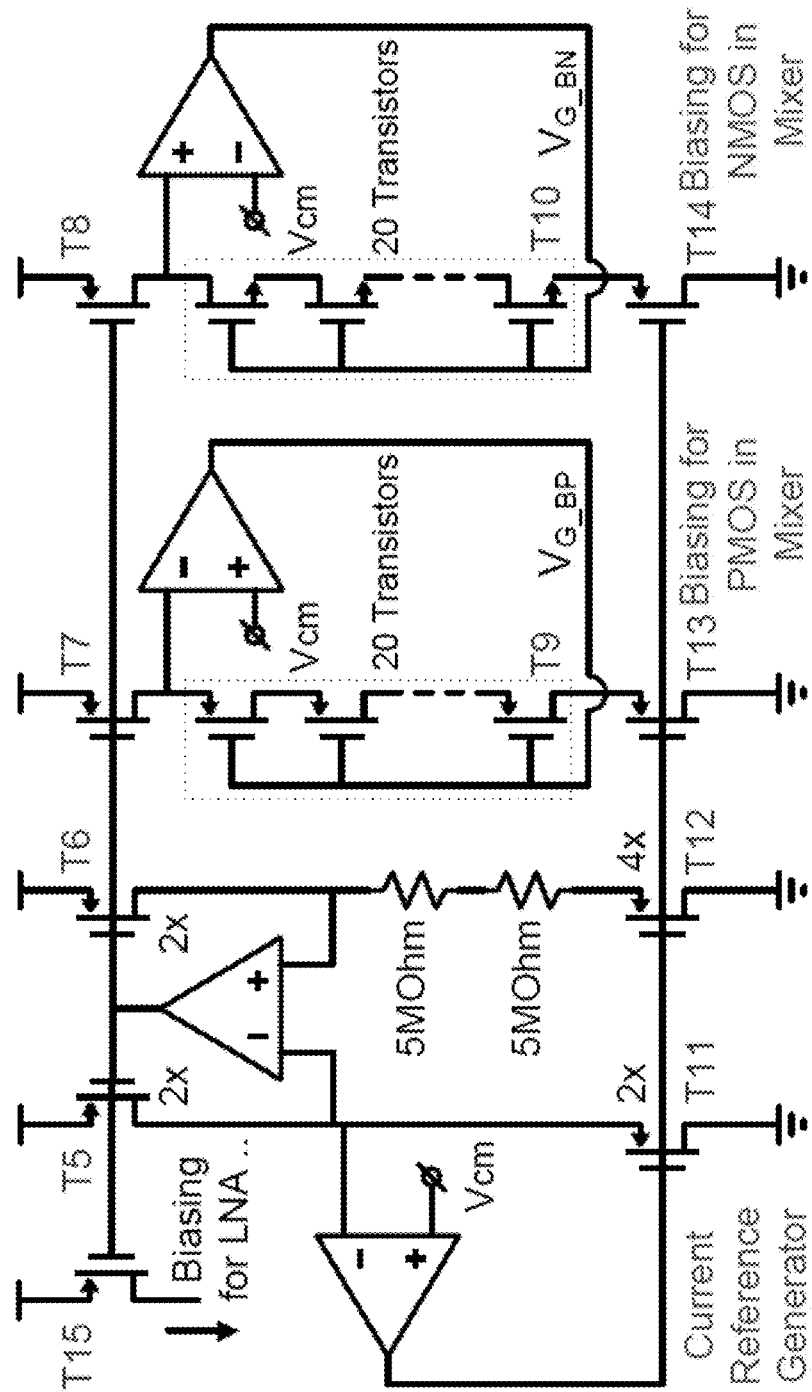
FIG. 13 is an example of a bias generator in accordance with some embodiments.

As shown in FIG. 13, in accordance with some embodiments, the bias potentials $V_{G\_BN}$ and $V_{G\_BP}$ for biasing the self-mixer transistors T1, T2, T3 and T4 can be generated by comparing a replica of these transistors with a 10 MΩ poly-resistor (illustrated in FIG. 13 as two 5 MΩ resistors) used in a 2 nA PTAT (proportional to absolute temperature) current reference circuit. This PTAT current reference circuit biases transistors T9 and T10 to set the desired resistance. The generated DC potentials $V_{G\_BN}$ and $V_{G\_BP}$ for NMOS and PMOS, respectively, set the resistance of T1, T2, T3, and T4. This current-controlled biasing technique makes the self-mixer resilient to process and temperature variations.

The signal-to-noise ratio at the output of the self-mixer is:

$$SNR_{edo} = \frac{1}{4K_BTBW_{BB}}\left[\frac{2+n}{4n}\right]^2\frac{A_v^4P_{in}^2R_s^2}{R_{in}V_t^2}$$

Both signal power and noise power increases in proportion to $N^2$. Thus, the SNR is independent of the number of stages used. Therefore, an increased number of stages does not improve sensitivity. However, it does provide an additional baseband gain which helps in reducing the power consumption of the baseband circuits.

The output signal is proportional to N, therefore, multiple stages can be treated as providing passive gain before the baseband in some embodiments. This passive gain relaxes the noise requirements and reduces the active power consumption of the baseband circuits in some embodiments.

With increasing number of self-mixer stages, the provided bandwidth decreases. The self-mixer can be treated as an RC transmission line, where the resistance $R_{tx}=R_{in,ed}\cdot N$ and the capacitance $C_{tx}=C_C$. The step input to output transfer function for a transmission line with an open circuit load is the error function:

$$v_{edo}(t) = v_{edo}\text{erf}\left(\frac{N\sqrt{R_{tx}C_{tx}}}{2\sqrt{t}}\right)$$

Thus, the equivalent bandwidth is $0.46/(N^2R_{tx}C_{tx})$. With increasing number of stages, the available baseband bandwidth reduces.

Figure 14:
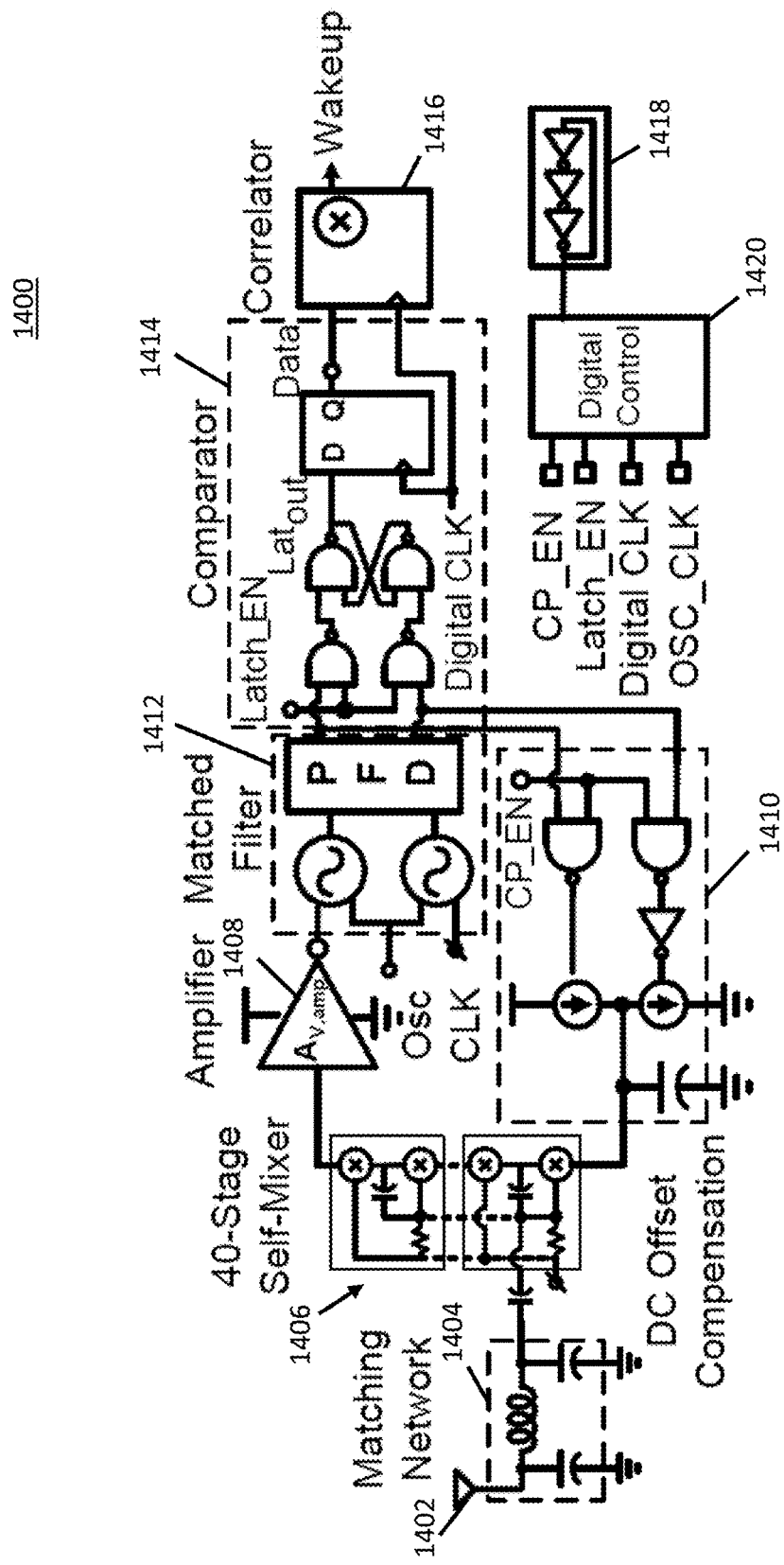
FIG. 14 is an example of a wake-up receiver architecture in accordance with some embodiments.

Turning to FIG. 14, an example 1400 of a wake-up receiver architecture in accordance with some embodiments is shown. As illustrated, architecture 1400 includes an antenna 1402, a matching network 1404, a 40-stage self-mixer 1406, a current-reuse inverter-based voltage amplifier 1408, a matched filter 1412, a comparator 1414, a correlator 1416, a clock source 1418, and a digital control circuit 1420.

In some embodiments, architecture 1400 is configured to detect an 11-bit wake-up code that is on-off-key (OOK) modulated at data-rate $f_{DATA}$ of 100 bps on an RF carrier.

In architecture 1400, time-encoded clocked integration using clock-triggered voltage-controlled delay lines (VCDL) can be used to implement a matched filter for the rectangular-bit shape to reduce baseband noise. The outputs of the VCDLs can then be compared using a phase-frequency detector (PFD). PFD UP/DOWN output pulses from the PFD can then drive a Set-Reset latch in comparator 1414. This effectively implements a comparator or a 1-bit ADC for the time-encoded signal. The comparator can be clocked at a sampling rate $fs=2$ $f_{DATA}$ to effect 2× oversampling. The PFD output pulses can also be fed back to the self-mixer reference node via a charge pump in 1410. This creates a first order, low bandwidth, delay-locked loop to reject DC signals due to any DC offsets introduced by the baseband signal processing circuits or due to a continuous-wave interferer at the receiver input (as described below in connection with FIGS. 19 and 20).

To better understand how a self-mixer's design impacts a receiver front end that incorporates the self-mixer, assume that a received RF input signal, $V_{in}(t)$, is an amplitude modulated signal at a carrier frequency $f_{RF}$ and is incident on an antenna of the receiver with a radiation resistance $R_s$. The root-mean squared (RMS) voltage signal at the antenna is $V_{in,RMS}{}^2 = P_{in}R_S$ wherein $P_{in}$ is the received signal power. An L-C matching network of the receiver then amplifies this voltage with a passive voltage gain $A_v = V_{edin}/V_{in}$. This $A_v$ depends on the load resistance $R_{in,ed}$ and the capacitance $C_{in}$ of the self-mixer. $C_{in}$ may be a combination of the capacitances from any off-chip inductor (in the matching network), packaging, bond-wire(s), an on-chip electrostatic discharge (ESD) circuit, the self-mixer, and/or any other connected components in some embodiments. Assuming that an inductor with value $L_{ind} \approx 1/(\omega_{RF}{}^2 C_{in})$ with a self-resonance frequency much higher than $\omega_{RF}/(2\pi)$ and a quality factor $Q_{ind}$ is used in the matching network, an optimal $R_{in,ed}$ may be $R_{in,ed} = Q_{ind}/(\omega_{RF} C_{in})$ in some embodiments. For example, in some embodiments, for a $Q_{ind}$ of 80 and a capacitance $C_{in}$ of 1 pF at 434 MHz, an optimal $R_{in,ed}$ for the self-mixer may be 30kΩ. The passive gain from the matching network may then be $A_v = \sqrt{R_{in,ed}/(2R_s)}$ in some embodiments.

In accordance with some embodiments, the conversion gain constant $k_{ed}$ of a self-mixer can be $N/(2nV_t)$, and the output noise PSD of a self-mixer can be written as $PSD_{vn,edo} = 4k_B T N^2 R_{in,ed}$.

In some embodiments, the receiver sensitivity for a continuous-wave RF input signal as a function of self-mixer $R_{in,ed}$, matching network Av, baseband noise-figure NF, required SN $R_{req}$ and baseband sampling rate $f_s$ can be:

$$\text{Sensitivity}|_{dBm} = \frac{1}{2}(SNR_{req}|_{dB} + NF|_{dB}) - A_v|_{dB} + 10\log\left[\sqrt{\frac{4k_B T R_{in,ed} f_s (2nV_t)^2}{R_s^2}} \Big/ 1\text{ mW}\right]$$

Figure 15:
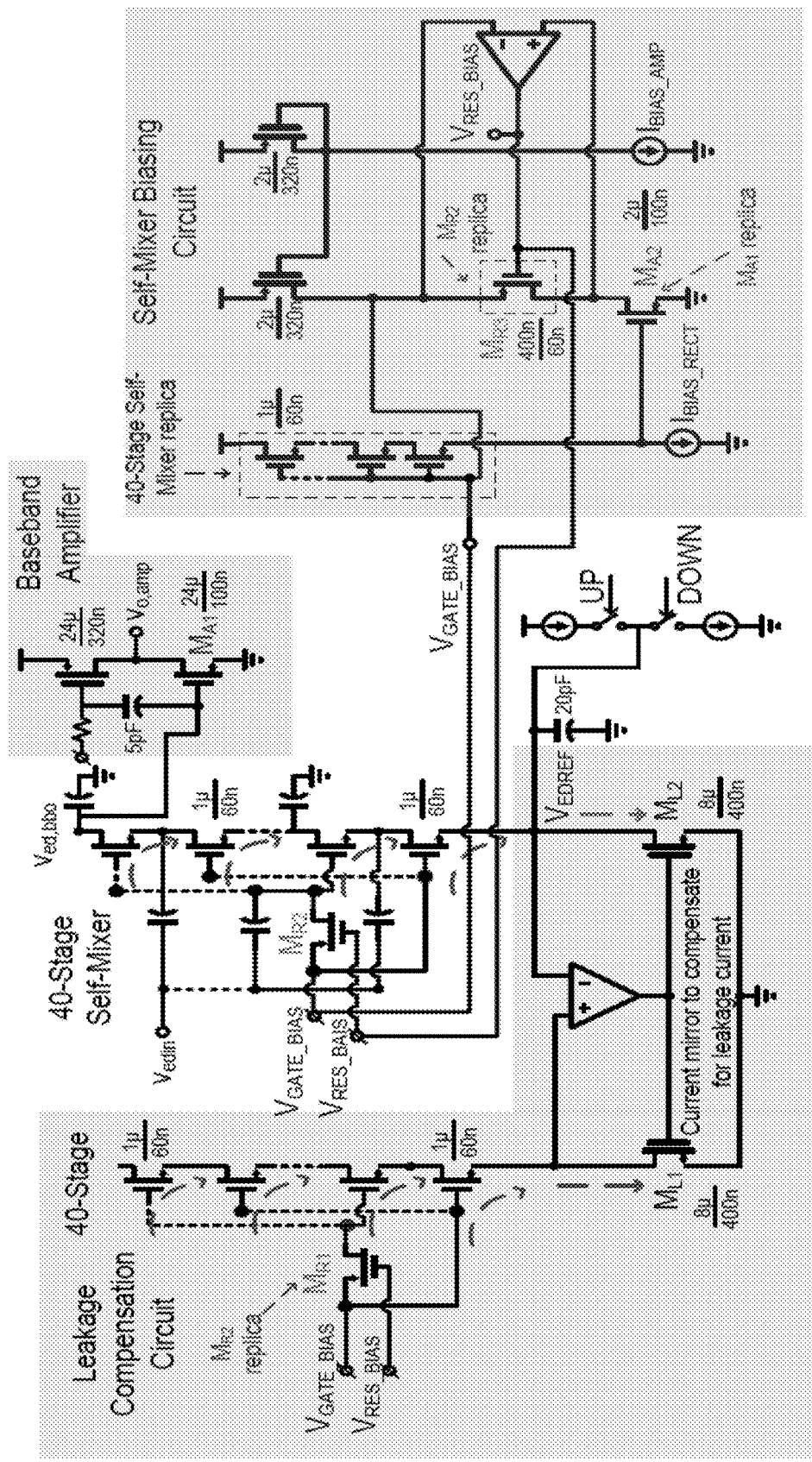
FIG. 15 is an example of an implementation of a self-mixer and a baseband amplifier in accordance with some embodiments.

FIG. 15 shows an example implementation of a self-mixer and a baseband amplifier in accordance with some embodiments. Although specific size components and types of components are described in connection with FIG. 15, it should be apparent that other suitable size components and types of components can be used in some embodiments.

As illustrated in FIG. 15, the source of the self-mixer, $V_{EDREF}$, is floating and connected to a 20 pF capacitor that is driven by a charge pump; this creates a DC feedback loop. The output of the self-mixer, $V_{ed,bbo}$, is connected to the baseband-amplifier NMOS transistor $M_{A1}$. The self-mixer operates in the linear region, and the DC gate potential of $M_{A1}$ is the same as DC potential at $V_{EDREF}$.

The DC gate bias $V_{G\_B}$ of the self-mixer leads to a gate-to-drain leakage current. If uncompensated, this current could increase the potential $V_{EDREF}$, negating the effect of gate-biasing. FIG. 15 shows a leakage-compensation circuit in which a replica self-mixer (without $C_C$ and $C_L$) is used to sense the leakage current using transistor $M_{L1}$; this current is mirrored to $M_{L2}$ and compensates for the leakage in the self-mixer. A varying $V_{EDREF}$ can change the leakage current. In order to address this, an operational amplifier in the leakage-compensation circuit controls the current mirror using a replica self-mixer circuit to compensate for the leakage so that the DC potential at $V_{EDREF}$ is fixed.

FIG. 15 also shows a biasing circuit that can be used to generate $V_{G\_B}$ and $V_{RES\_BIAS}$ in some embodiments. As shown, the biasing circuit includes a replica $M_{A2}$ of the NMOS transistor $M_{A1}$. The biasing circuit also includes a series of 40 self-mixer replica transistors, wherein each of the 40 replica transistors is the same size as a corresponding transistor in the 40-stage self-mixer to keep track of the threshold variations. This is operated as a source follower with a drain current source of $I_{BIAS\_RECT}$. The current source $I_{BIAS\_AMP}$ sets the gate-to-source potential for $M_{A2}$. The current source $I_{BIAS\_RECT}$ sets the potential $V_{G\_B}$. This current-controlled biasing technique makes the self-mixer resilient to voltage and process variations.

Transistor $M_{R2}$ is biased as a resistor for AC-coupling the RF signal in the self-mixer. A replica transistor $M_{R3}$ is used to generate the bias potential $V_{RES\_BIAS}$ for setting the resistance of $M_{R2}$.

Figure 16:
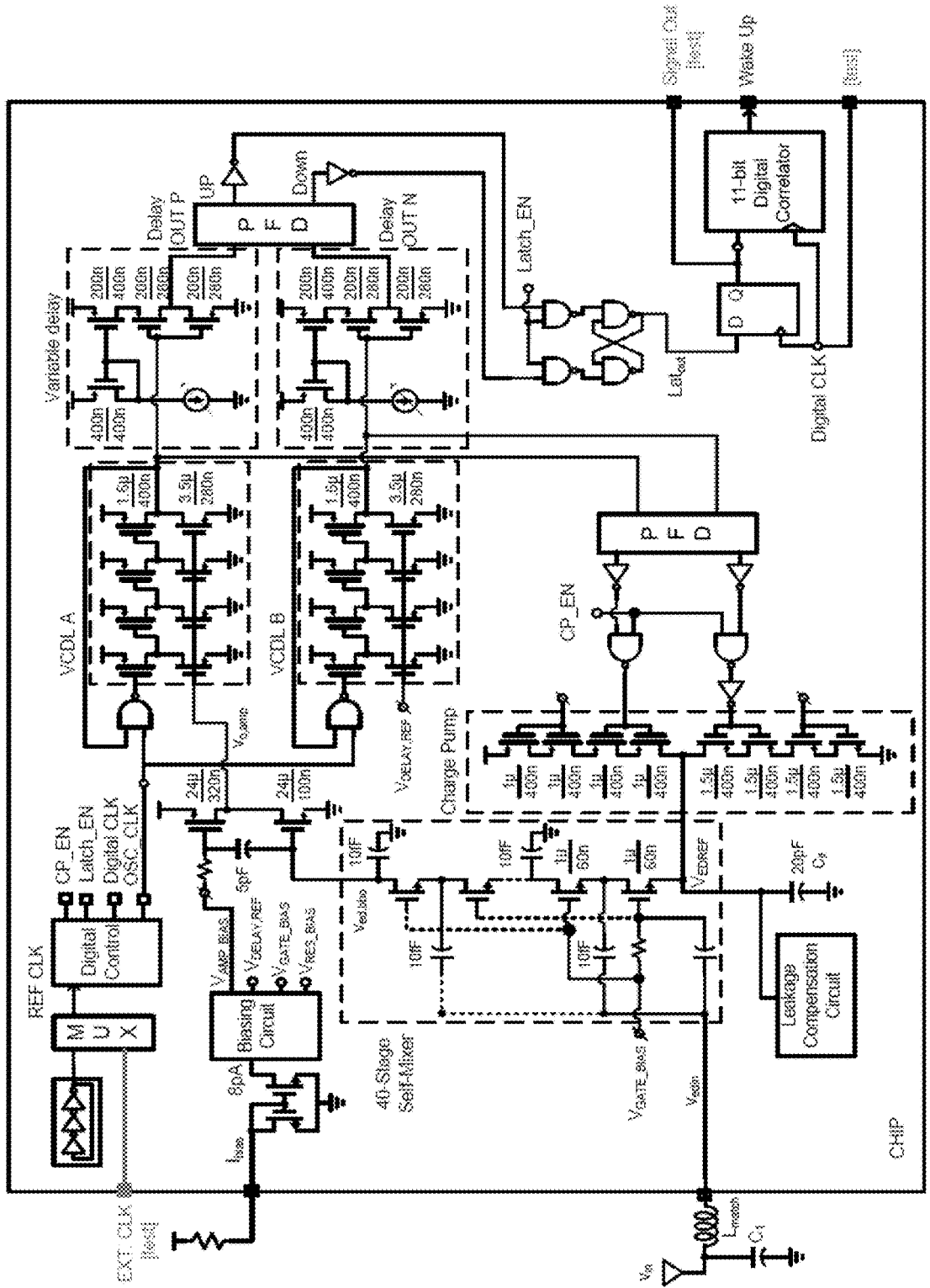
FIG. 16 is an example of a detailed schematic of a wake-up receiver in accordance with some embodiments.

FIG. 16 shows a more detailed schematic of a wake-up receiver in accordance with some embodiments. Although specific size components and types of components are described in connection with FIG. 16, it should be apparent that other suitable size components and types of components can be used in some embodiments.

In some embodiments, the receiver shown in FIG. 16 can be implemented to operate at any suitable frequency. For example, in some embodiments, receiver(s) can be implemented to operate at 151.25 MHz, 434.4 MHz and/or 1.016 GHz using the matching network design in FIG. 16 with the component values below:

| Frequency | $L_{ind}$ | Inductor Details | $C_1$ |
|---|---|---|---|
| 151.25 MHz | 1 μH | 26 AWG Cu 13 turns | 30 pF |
| 434.4 MHz | 111 nH | 132-10SM Coilcraft | 14 pF |
| 1.016 GHz | 27 nH | 0908-SQ Coilcraft | 3.3 nH* |

*Note:
The Q-factor of the capacitors degrades with increasing frequency. Thus, for the 1.016 GHz implementation, a matching network with 3.3 nH inductor can be used instead of capacitor C1 to reduce losses.

As shown in FIG. 16, the output of the matching network is connected to the 40-stage self-mixer with an $R_{in,ed}$ of 200 kΩ at 151 MHz and 434.4 MHz and 50 kΩ at 1.016 GHz. The source of the multi-stage self-mixer $V_{edref} = V_{EDREF} + V_{edref}(t)$ is connected to a delay-locked loop (DLL).

The self-mixer output, $V_{ed,bbo}$, is amplified by gain $(-A_{v,amp})$ of 26 dB using a current-reuse baseband amplifier with output $V_{o,amp}(t)$. Its input-referred noise is $2kTn/(g_m)$; assuming n=1.2 and $g_m/I_d$=29, an $I_d$=370 pA, the amplifier NF compared to the self-mixer output noise ($R_{in,ed}$=200 kΩ) is 1 dB while the power consumption is only 150 pW at 0.4 V. The PMOS transistor is current biased using a current mirror with AC coupling while the NMOS transistor is biased through the DC feedback loop created by the DLL. Additionally, the DLL provides a high-pass response in the signal path and rejects the low-frequency flicker noise added by the amplifier.

A windowed integrator implementation using time-encoded analog signals can be adapted to be used as a matched detector for the rectangular bit shape; it filters the high-frequency baseband noise and ensures that the noise bandwidth is $f_s$ to optimize the SNR before sampling.

Figure 18:
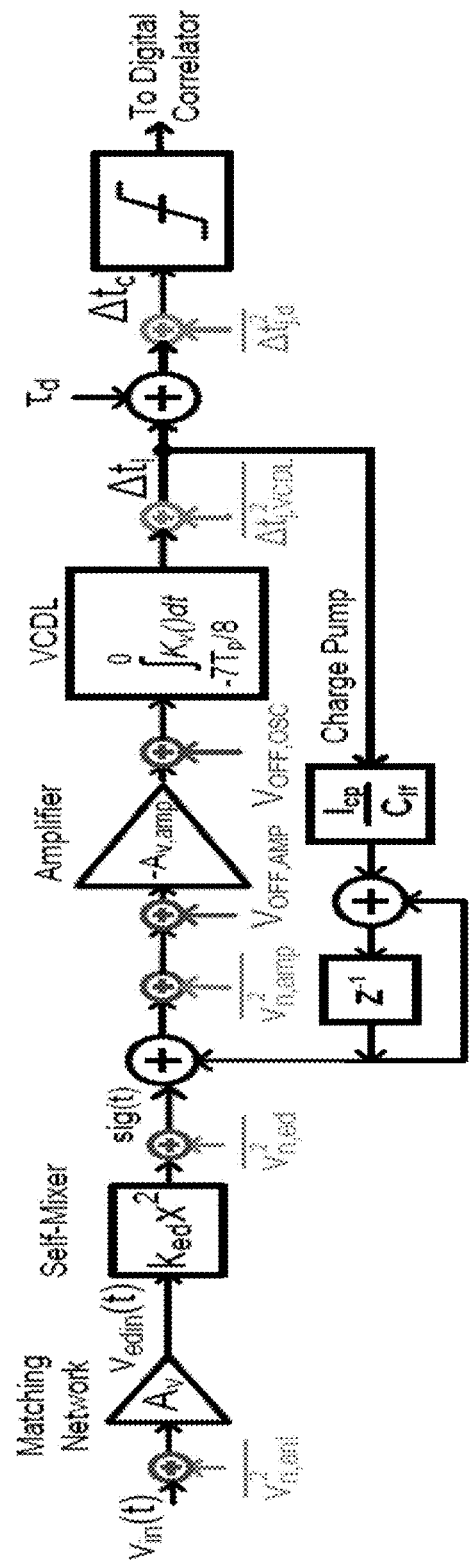
FIG. 18 is an example of a multi-domain model of a wake-up receiver in accordance with some embodiments.

Two voltage-controlled delay lines (VCDLA and VCDLB) (FIG. 16) with clocked feedback realize a V-to-T signal conversion and time-encoded integration. The operation principle is illustrated in FIG. 18. The rising-edge of the OSC_CLK triggers oscillation in VCDLs, with the frequency controlled by its respective input voltage, $V_{o,amp}$ and $V_{DELAY,REF}$. At the falling-edge of OSC_CLK, the relative position of the edges in VCDLs has the information of the output phase (relative delay), effectively integrating the input signal when OSC_CLK is "high." For an OSC_CLK time period $T_p$, the VCDLs integrate the signal for a time of $7T_p/8$ and remain in reset mode for the rest of the period. This is ensured by deriving the OSC_CLK from an 8×REF_CLK generated using an on-chip current-starved ring oscillator. Assuming the DC output of the amplifier is set as $V_{DELAY,REF}$ using the DC feedback for the DLL, the difference of the output pulse widths of the two VCDLs is:

$$\Delta t_l[kT_P]|_{(k-7/8)T_p}{}^{kT_p}K_{vco}T_{vco}v_{o,amp}(t)dt$$

where $K_{vco}$ is the voltage-to-frequency conversion gain and $T_{vco}=1/f_{vco}$ is the time period when VCDLA is operated as a VCO, and k is the index for the discrete-time samples. In z-domain:

$$\Delta t_l(z) = \frac{-7}{8}A_{v,amp}K_{vco}T_{vco}T_p\frac{V_{edref}(z)}{z} + sig(z)$$

where sig(z) is the Z-transform of the discrete samples sig[kTp]:

$$sig[kT_p]=-A_{v,amp}K_{vco}T_{vco}\int_{(k-7/8)T_p}{}^{nT_p}v_{edo}(t))dt$$

This can be used to evaluate the time-domain response of the DLL.

At the end of the OSC_CLK "high" pulse, $\Delta t_l$ is measured using phase-frequency detector (PFD). The relative pulse-widths of the UP/DOWN pulses provides a measure if $\Delta t_l \geq 0 | \Delta t_l \leq 0$. These UP/DOWN pulses trigger an SR-latch to operate as a comparator. The output of the SR-latch is sent to an 11-bit digital correlator.

A non-zero threshold for the comparator needs to be set for a low false-alarm rate. The DLL sets $\Delta t_l=0$ at the output of the VCDLs. Additional current-starved inverter delay cells in the signal and reference path with a different delay ($\tau_N$ and $\tau_P$) are added in each branch after VCDLs to set the threshold. The threshold can be configured for false alarm to be less than one per hour in some embodiments.

The receiver uses 2× oversampling to receive the wake-up code. As a result, either the even or the odd samples will be aligned with the incoming data signal. The on-chip 100 pW 11-bit sliding-window digital correlator skips every alternate bit and thus correlates with the most reliable data. D-flipflop shift registers keep the last twenty-two samples, XOR gates multiply the received code with the desired wake-up code, and a 4-bit full-adder sums the XOR outputs; the adder output is then compared with a correlation threshold.

$\Delta t_l[kT_p]$ is also sensed using a separate PFD and is fed back to the reference input of the self-mixer using a charge pump with a load capacitor $C_{lf}$ as shown in FIG. 16. The loop sets $\Delta t_l=0$ at DC, thus forming a delay-locked loop. This sets the amplifier output DC potential equal to $V_{EDREF}$, which then biases the voltage amplifier as well.

Figure 17:
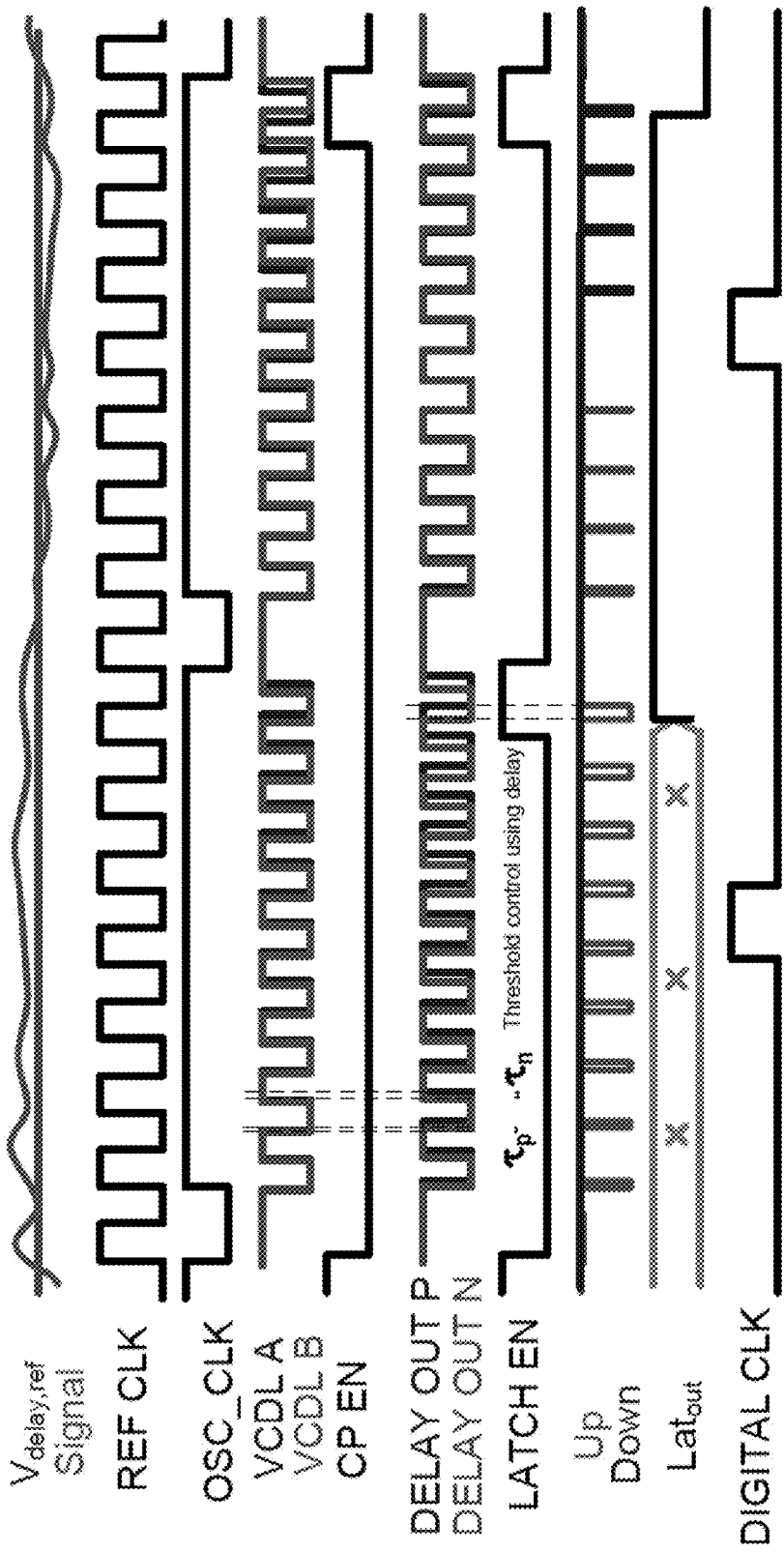
FIG. 17 is an example of a timing diagram in accordance with some embodiments.

The charge-pump output can be written as $v_{edref}[KT_p]=v_{edref}((k-1)T_p)+I_{CP}\Delta t_l(kT_p)/C_{lf}$, where $I_{CP}$ is the charge-pump current of 1 pA and $C_{lf}$ is a load capacitor of 20 pF. This feedback loop is enabled for every alternate sample for a time of $T_p/8$ at the end of integration cycle controlled by CP_EN in FIG. 17. The discrete-time operation of the DLL justifies the use of a Z-domain model for analysis as shown in FIG. 18. The Z-domain transfer function from sig(z) to $\Delta t_l(z)$ is:

$$\frac{\Delta t_l(z)}{sig(z)} = \frac{1-z^{-1}}{1-(1-G_{loop})z^{-1}}$$

where loop gain: $G_{loop}=(7T_p/8)A_{v,amp}K_{vco}T_{vco}I_{CP}/C_{lf}$. The transfer function represents a high pass filter with a cutoff frequency of $f_s/100$, with $f_s=200$ Hz.

In some embodiments, the settling time of the DLL may limit the number of consecutive "1"s in the wake-up code to three (or any other suitable value). If a code with more consecutive "1"s is necessary or desirable, RZ-encoding or Manchester encoding can be used in some embodiments.

The region of convergence (ROC) is defined by $|z|>|(1-G_{loop})|$. For a causal and stable linear time invariant system, the ROC must extend the outermost pole to infinity and must include the unit circle $|z|=1$ in some embodiments. Therefore, $G_{loop}$ must be less than 1 in some embodiments. This sets the charge-pump current $I_{CP}$ and capacitance $C_{lf}$.

The amplifier and the VCDLs add random DC offsets modeled as $V_{OFF,AMP}$ and $V_{OFF,OSC}$ in FIG. 18. The charge pump in the feedback loop creates a zero at DC, so that the DC offsets are rejected. Thanks to this baseband offset cancellation, very small transistors can be used in the VCDLs, even though they introduce larger mismatches, and the VCDLs can operate with only 50 pW each.

The comparator threshold can be set sufficiently large so that there is a low probability to trigger a false wake-up at any suitable rate (e.g., less than one per hour).

The false-alarm probability is the probability that the comparator output is the desired wake-up code due to the noise present in the receiver. Assuming a receiver sampling rate of $f_s$, the total number of bits received in an hour is $3600 \cdot f_s$. Let H be the number of "1"s in a wake-up code. For x-bit error tolerance in the correlator, the total number of false positives generated are approximately equal to $3600 f_s{}^H C_x P^{H-x}$ where P is the probability of comparator output to be "1". It is assumed that the probability of receiving a "0" is close to 1 for simplicity. Therefore, P is required to be less than:

$$(1/((3600f_s{}^H C_x)^{1/(H-x)}))$$

for a false alarm rate of less than one per hour. For $f_s$ equal to 200 samples per second and a desired 11-bit wake-up code "11100100110" received with 1-bit error tolerance, the required P can be 4.7%. Assuming a Gaussian noise distribution, the corresponding threshold required is $$\tau_d = 1.7\sigma = 1.7\sqrt{\Delta t_{j,ed}^2},$$

wherein $\Delta t_{j,ed}{}^2$ is the jitter contribution due to the self-mixer.

In some embodiments, at least a certain SNR may be required at the input of the comparator for successful detection of a wake-up code based on the comparator threshold derived above for a given false-alarm rate. For an x-bit error tolerance, the receiver must miss at least (x+1) bits in order to miss a wake-up signal. Assuming that the probability of missing (x+2) bits or more in a code will be low compared to missing only (x+1) bits, the probability of missed detection is approximately equal to ${}^H C_{X+1} P_1{}^{x+1}$, where $P_1$ is the probability of a missed bit. For a required missed-detection ratio (MDR) of $10^{-3}$, with N=6, and 1-bit error tolerance, $P_1$ is required to be 0.008, requiring the input signal of the comparator to be 2.4σ above the threshold. Therefore, a total signal amplitude of 4.1σ is required for signal detection, thus requiring a 12.3 dB SNR at the input of the comparator.

In some embodiments, a receiver can be implemented to account for one or more interferers received at the receiver's antenna.

Figure 19:
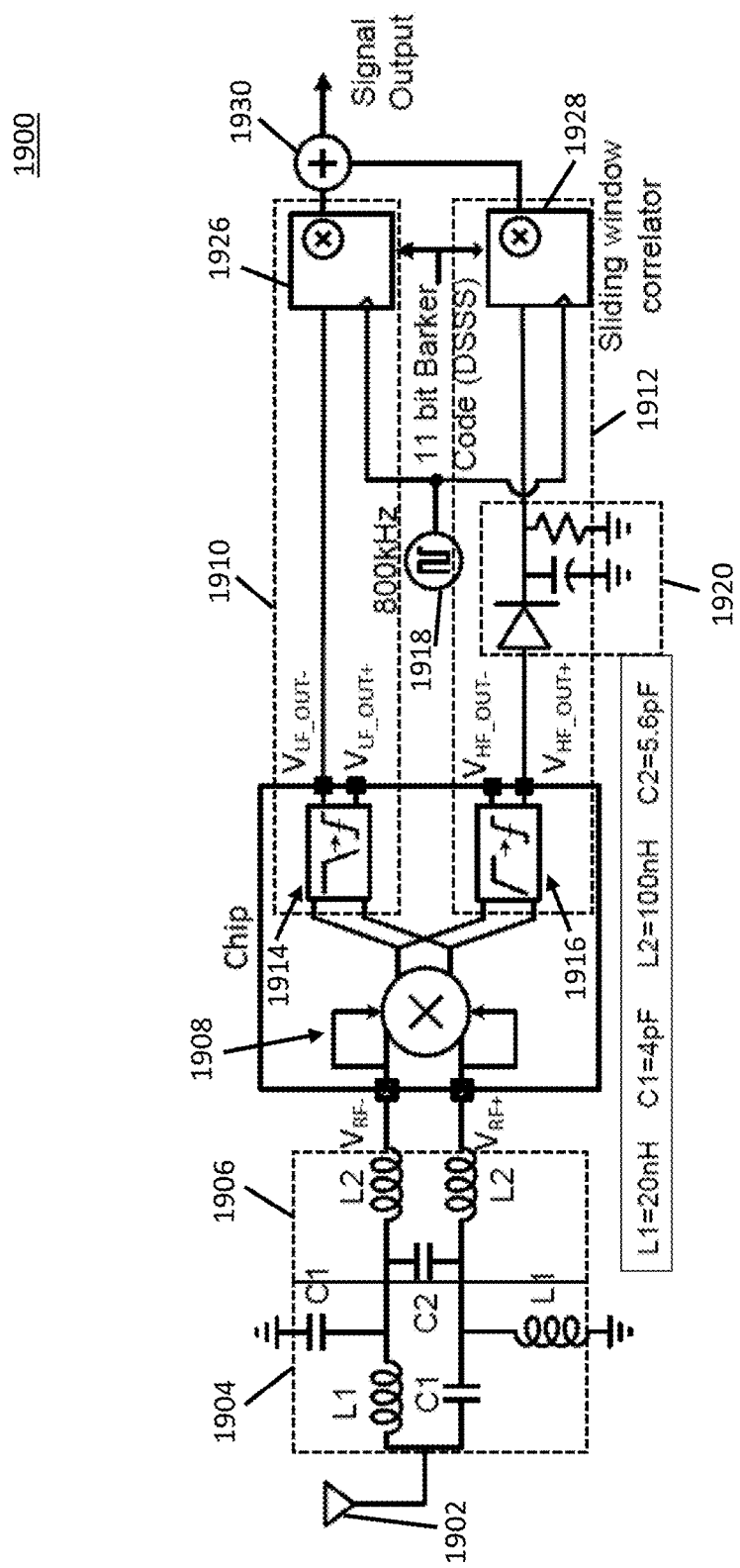
FIG. 19 is an example of a receiver having a low frequency path and a high frequency path that can be used to account for an interferer in accordance with some embodiments.

For example, in some embodiments, as shown in FIG. 19, a receiver 1900 having a low frequency path and a high frequency path can be used to account for an interferer. As illustrated, receiver 1900 includes an antenna 1902, a four-element passive balun 1904, a matching network 1906, a differential self-mixer 1908, a low frequency (LF) path 1910, a high frequency (HF) path 1912, a low-pass filter and hysteresis comparator 1914, a high-pass filter and hysteresis comparator 1916, a clock 1918, an envelope detector 1920, sliding window correlators 1926 and 1928, and an adder 1930. It should be noted that some inductor and capacitor values are shown for illustrative purposes in FIG. 19 and that other values can be used in some embodiments.

In some embodiments, any suitable type of interferer can be accounted for.

Figure 20:
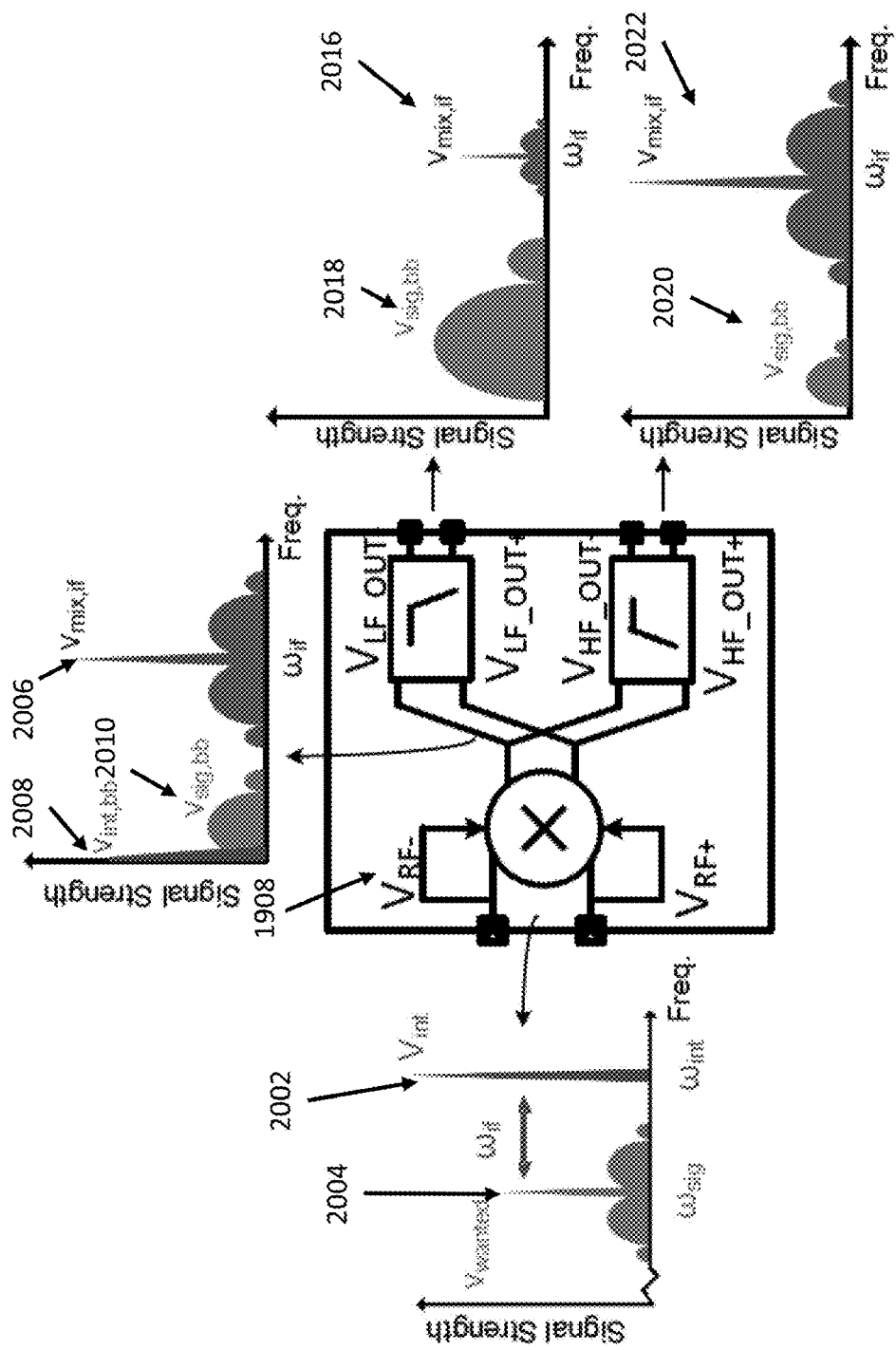
FIG. 20 is an example of a diagram illustrating how an interferer impacts a receiver having a self-mixer in accordance with some embodiments.

For example, in accordance with some embodiments, assume that an interferer Vint that is a constant amplitude sine wave (i.e., with no amplitude or phase modulation) is received. FIG. 20 shows an example of corresponding spectra at the input and output of differential self-mixer 1908 of receiver 1900 of FIG. 19 that may be seen for this interferer. In the differential self-mixer, $V_{int}$ 2002 acts as a local oscillator (LO) and mixes with a wanted signal $V_{wanted}$ 2004 to generate a copy of the desired signal at the IF frequency as $V_{mix,if}$ 2006 while $V_{int,bb}$ 2008 is a signal at DC, typically larger than $V_{sig,bb}$ 2010. These signals may then be processed in the low frequency (LF) and high frequency (HF) paths.

In the LF path, the baseband signal is amplified (by self-mixer 1908), low-pass filtered (by the low-pass filter of 1914 so that the filter attenuates high-frequency signals (in this case, $V_{mix,if}$ 2016 of FIG. 20), and passes low-frequency signals (in this case, $V_{sig,bb}$ 2018 of FIG. 20)) and then sliced (by the hysteresis comparator of 1914) to remove the high-frequency signals.

In the HF path, the baseband signal is amplified (by self-mixer 1908), high-pass filtered (by the high-pass filter of 1916 so that the filter attenuates low-frequency signals (in this case, $V_{sig,bb}$ 2029), and passes high-frequency signals (in this case, $V_{mix,if}$ 2022)), and sliced (by the hysteresis comparator of 1916) to remove the low-frequency signals, and then envelope detection is performed (by envelope detector 1920) to demodulate the signal.

In some embodiments, signal $V_{mix,if}$ in the HF path can increase one dB per one dB increase in interferer power while noise from the self-mixer remains constant. Thus, the sensitivity of the receiver in the HF path can improve by one dB for one dB increase in the interferer power in some embodiments.

As another example of a type of interferer that can be accounted for in some embodiments, assume that a strong phase modulated (PM) or frequency modulated (FM) interferer (i.e., with no amplitude modulation, but with phase modulation) is received. In this case, $V_{sig,bb}$ and $V_{int,bb}$ are independent of the phase modulation. Also, in this case, $V_{mix,if}$ carries the amplitude modulation of the wanted signal and the phase modulation of the interferer. Therefore, $V_{mix,if}$ can be demodulated using the envelope detector in the HF path, to make it insensitive to the phase modulation of the interferer. Hence, the receiver can treat a PM/FM interferer as a narrowband carrier and have the performance as described above for the signal in the presence of a narrowband carrier.

Figure 21:
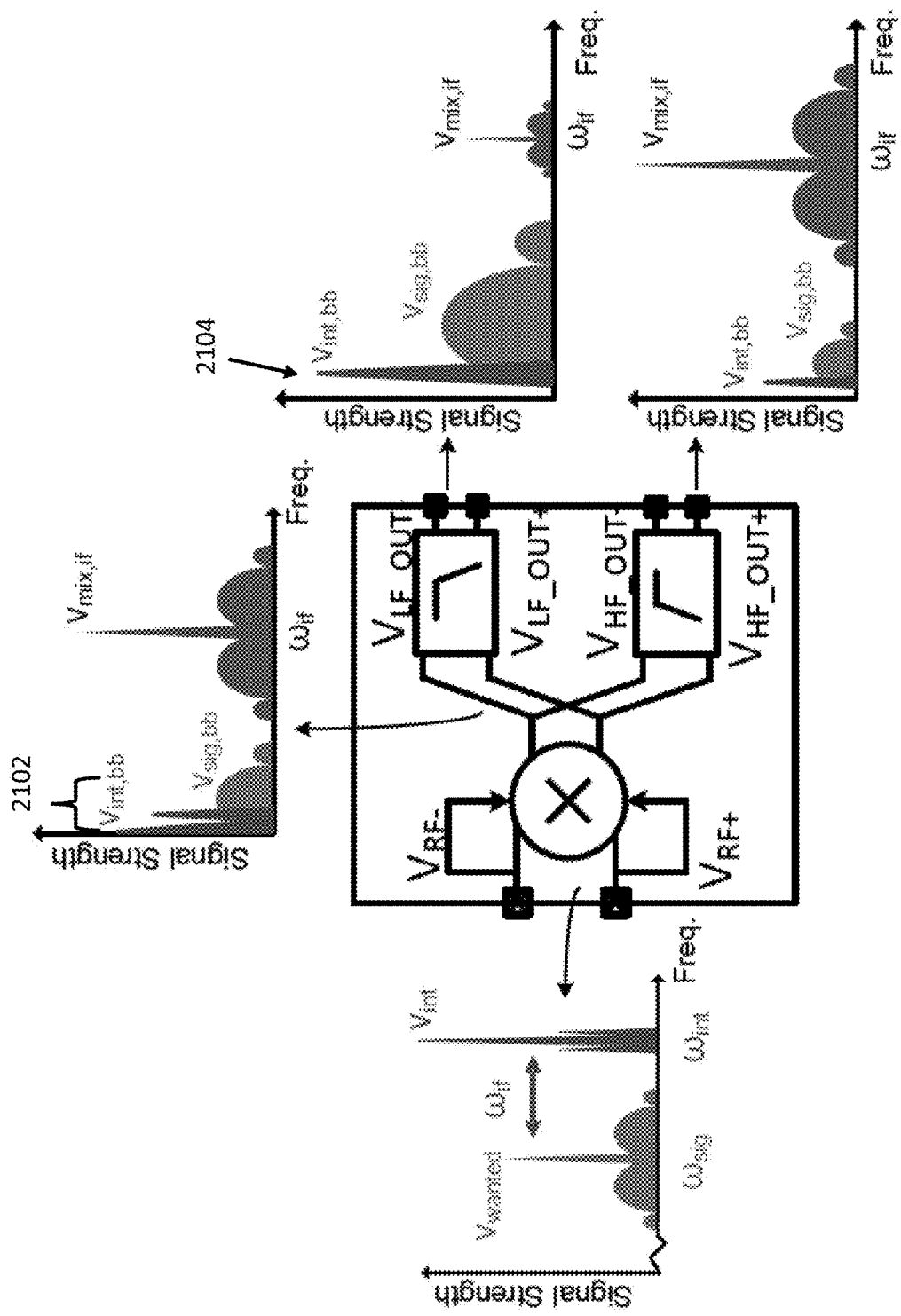
FIG. 21 is an example of another diagram illustrating how an interferer impacts a receiver having a self-mixer in accordance with some embodiments.

As yet another example of a type of interferer that can be accounted for in some embodiments, assume that an AM interferer is received. FIG. 21 shows an example of corresponding spectra at the input and output of differential self-mixer 1908 of receiver 1900 of FIG. 19 that may be seen for this interferer. As shown in area 2102, the frequency content of the interferer $V_{int,bb}$ may overlap with the content of the wanted signal $V_{sig,bb}$ and for a strong AM interferer the wanted signal in the LF-path may get blocked by the strong AM interferer as shown by signal 2014.

Figure 22:
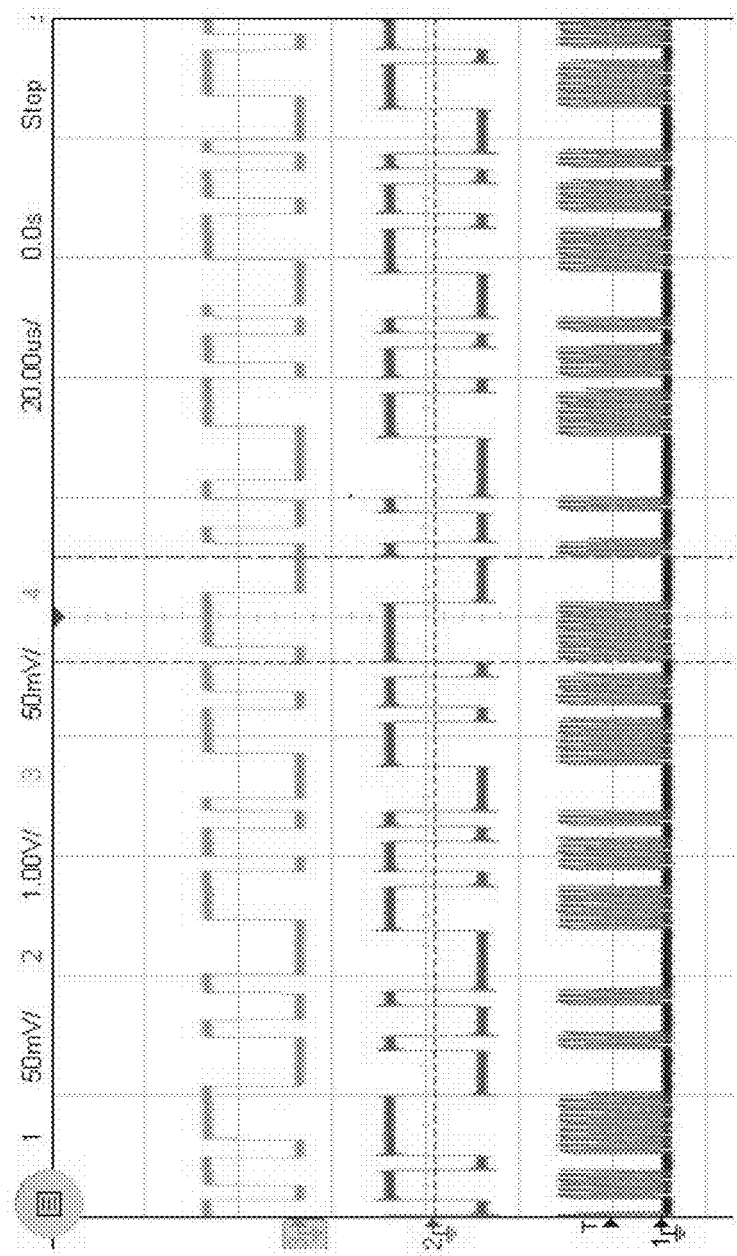
FIG. 22 is an example of a drawing showing how a transmitted signal can be impacted by an interferer in a receiver in accordance with some embodiments.

However, in some embodiments, $V_{mix,if}$ can be processed in the HF-path to obtain the wanted signal. The modulation of the wanted signal is a random stream of "1"s and "0"s as shown by the middle waveform of FIG. 22. For an AM interferer with low-modulation index (e.g., $m_{int}(t)<<1$), $V_{mix,if}$ will have an IF frequency ($\omega_{sig}-\omega_{int}$) output in the presence of "1", and no signal in the presence of "0" as shown by the bottom waveform in FIG. 22. This signal is then amplified with a limiting amplifier to remove the unwanted AM modulation of $m_{int}(t)$ and the wanted signal is retrieved using envelope detection at the IF frequency.

Referring back to FIG. 19, more details are now provided regarding the operation of receiver 1900. While specific values of components are provided herein for purposes of illustration, it should be understood that any other suitable values of components can be used in some embodiments.

As shown in FIG. 19, the receiver front end first converts a 50Ω antenna impedance into a 100Ω differential impedance using four-element passive balun 1904 that include inductors L1 (which can each have a value of 20 nH or any other suitable value(s) in some embodiments) and capacitors C1 (which can each have a value of 4 pF or any other suitable value(s) in some embodiments). The 100Ω differential impedance is then matched to the self-mixer's input resistance (which can have a value of 25 kΩ or any other suitable value in some embodiments) using a three-element matching network that includes a capacitor C2 (which can have a value of 5.6 pF or any other suitable value in some embodiments) and inductors L2 (which can each have a value of 100 nH or any other suitable value(s) in some embodiments, and which can each have a Q-factor of 30 (or any other suitable value(s)) at 550 MHz (or any other suitable value(s)) in some embodiments). A passive voltage gain may then be realized in some embodiments.

Next, RF-to-baseband down-conversion can implemented by components 1908, 1914, and 1916. In some embodiments, these components can be implemented in any suitable manner. For example, in some embodiments, components 1908, 1914, and 1916 can be implemented using example architecture 2300 shown in FIG. 23.

Architecture 2300 can include differential input capacitances at input terminals 2302 that can include any suitable capacitances at the RF input of the packaged chip including package (including bond-wire) capacitances, ESD capacitances, and self-mixer capacitances, which can be 165 fF, 65 fF and 188 fF, respectively, or any other suitable values in some embodiments.

Figure 23:
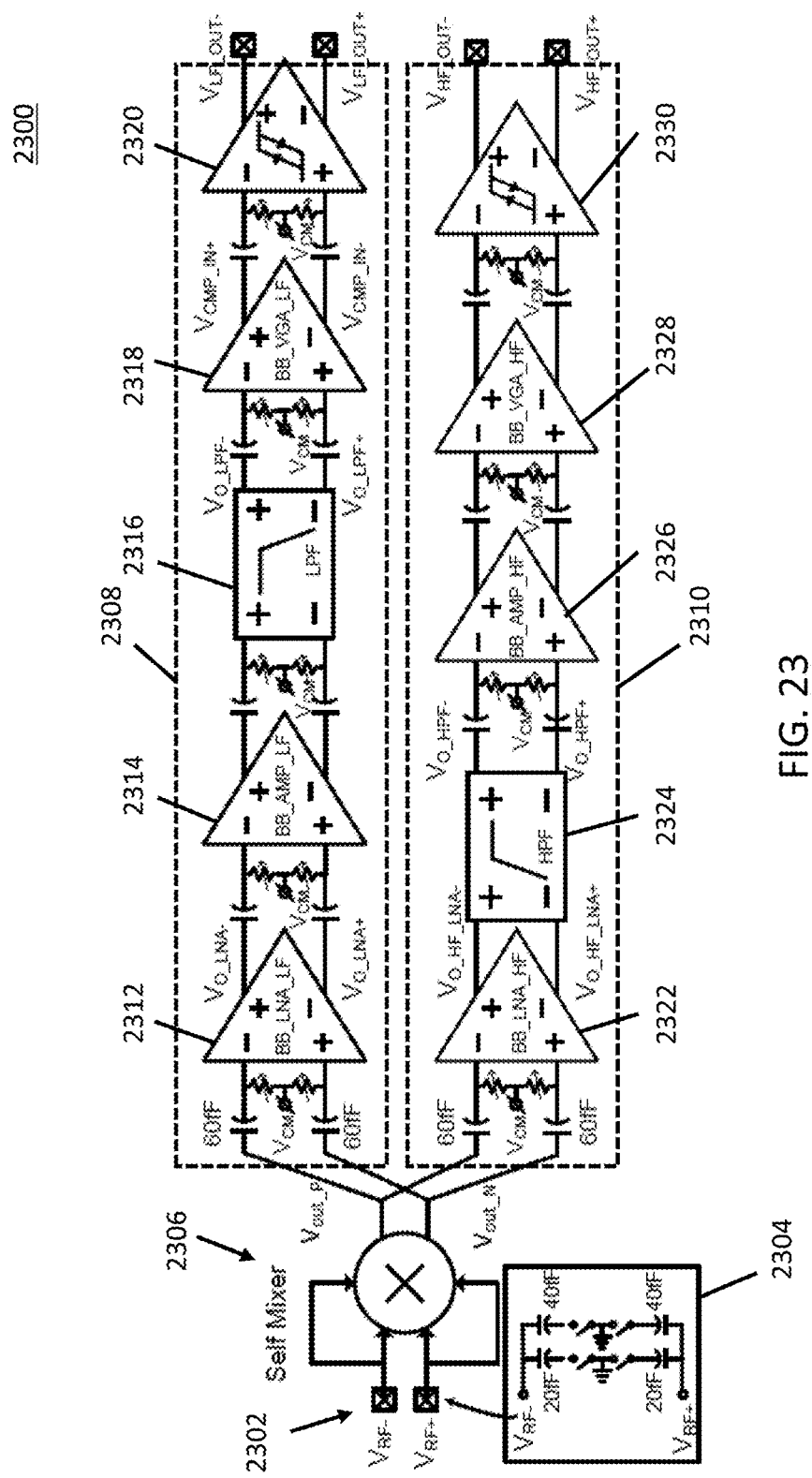
FIG. 23 is an example of an architecture for a self-mixer, a low-frequency path, and a high-frequency path of a wake-up receiver in accordance with some embodiments.

In some embodiments, two-bit on-chip trim capacitors 2304 can be included to fine tune the matching network to the desired RF frequency. As illustrated in FIG. 23, by setting the switch in 2304, the capacitances at terminals 2302 can be adjusted.

A 10-stage self-mixer 2306 can be connected to terminals 2302.

Architecture may further include an LF path 2308 and an HF path 2310, that can operate in an identical or similar manner to the LF path and the HF path described above. Path 2308 can include a baseband low-noise amplifier (BB_LNA_LF) 2312, a baseband amplifier (BB_AMP_LF) 2314, a low-pass filter (LPF) 2316, a baseband variable-gain amplifier (BB_VGA_LF) 2318, and a hysteresis comparator 2320. Path 2310 can include a baseband low-noise amplifier (BB_LNA_HF) 2322, a high-pass filter (HPF) 2324, a baseband amplifier (BB_AMP_HF) 2326, a baseband variable gain amplifier (BB_VGA_HF) 2328, and a hysteresis comparator 2330.

In some embodiments, the outputs of the LF and HF paths can be correlated off-chip with a Barker-code using sliding-window correlators 1926 and 1928 of FIG. 19.

During regular operation of the receiver, the LF-path demodulates the signal with a baseband LNA and a low-pass filter that filters inter-modulation products at the self-mixer output.

Figure 24:
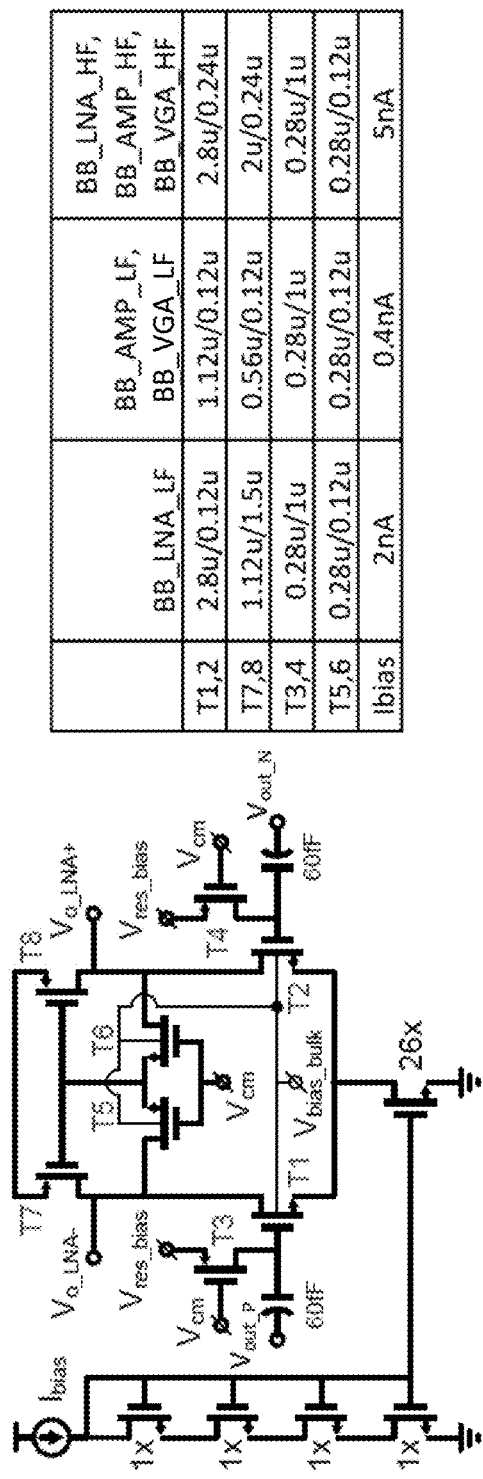
FIG. 24 is an example of an amplifier in accordance with some embodiments.

As shown in FIG. 24, BB_LNA_LF 2312, BB_AMP_LF 2314, BB_VGA_LF 2318, BB_LNA_HF 2322, BB_AMP_HF 2326, and BB_VGA_HF 2328 can be implemented as common-source differential amplifiers in some embodiments. The table in the figures gives example values for the different components of the figure depending on the application in FIG. 23.

When the circuit in FIG. 24 is used to implement an LNA (e.g., BB_LNA_LF 2312 or BB_LNA_HF 2322), body biasing techniques can be used to control the $V_{TH}$ variations of NMOS transistors T1, T2, T5, and T6, allowing the operation of the LNA at 0.5 V (or any other suitable voltage). The LNA can be AC-coupled to the self-mixer using PMOS transistors (T3, T4) operating in the linear region as 250 MΩ resistors and providing a 10 kHz high-pass cutoff for 400 kpbs data rate in some embodiments. Transistors T5 and T6 can be used as resistors for common-mode feedback in some embodiments.

When the circuit in FIG. 24 is used to implement a VGA, the variable gain can be implemented using 3-bit programmable common-mode feedback resistors implemented with T5 and T6 in some embodiments.

Figure 25:
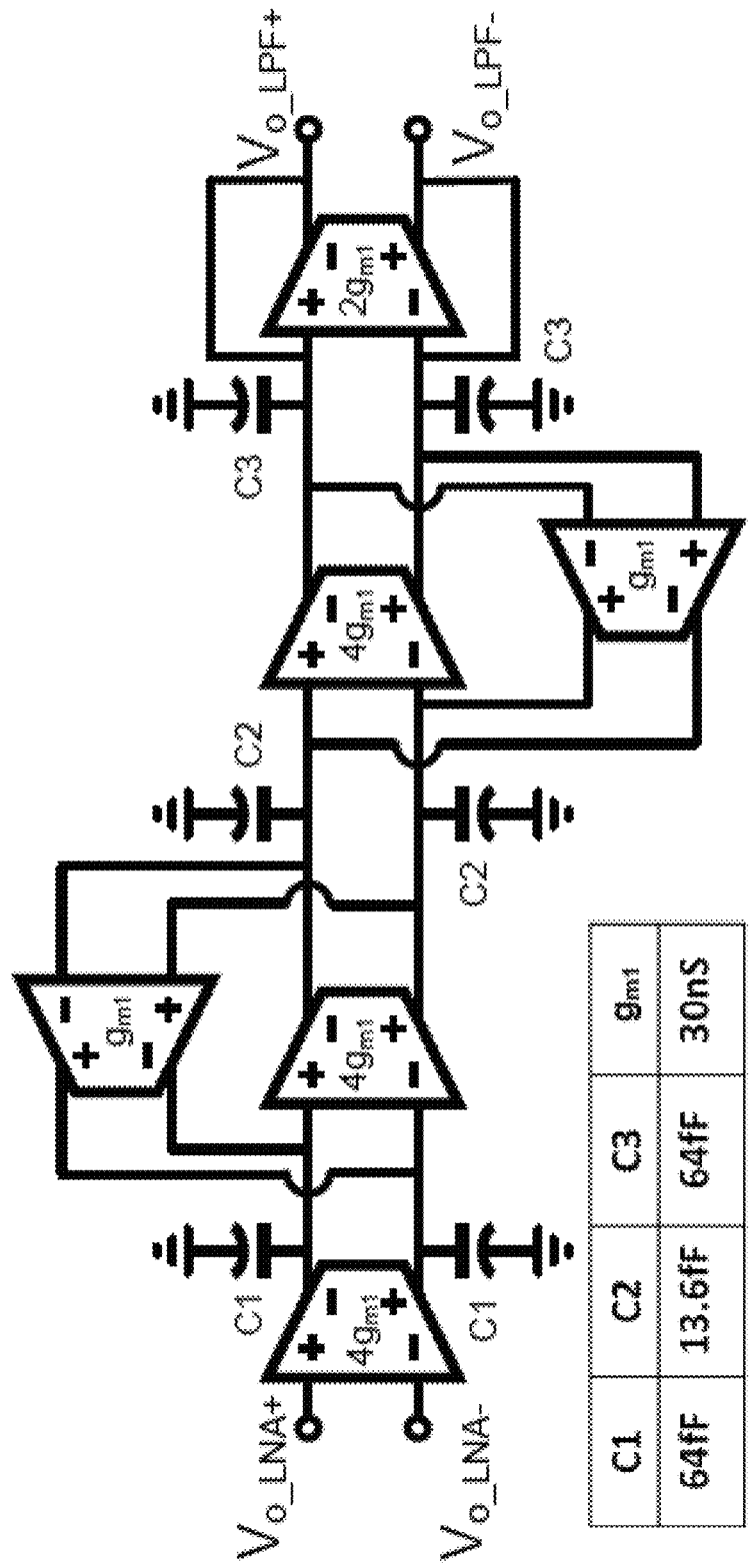
FIG. 25 is an example of a low-pass filter in accordance with some embodiments.

As shown in FIG. 25, LPF 2316 can be implemented as a third-order, current-biased, $g_m$-C, 500 kHz, Chebyshev low-pass filter for 400 kbps data rate in some embodiments. In some embodiments, this filter can be used in the LF path to reject the mixer output products beyond 1 MHz. MOS-capacitors can be used for small capacitors C1, C2 and C3. In some embodiments, the transconductors in FIG. 25 can be implemented in the same manner as BB_LNA_LF 2312 in FIG. 24. In some embodiments, the transconductors can operate in weak inversion, causing a PTAT current source to provide a constant transconductance. This can keep the LPF cutoff constant across temperature to the first order in some embodiments.

Figure 26:
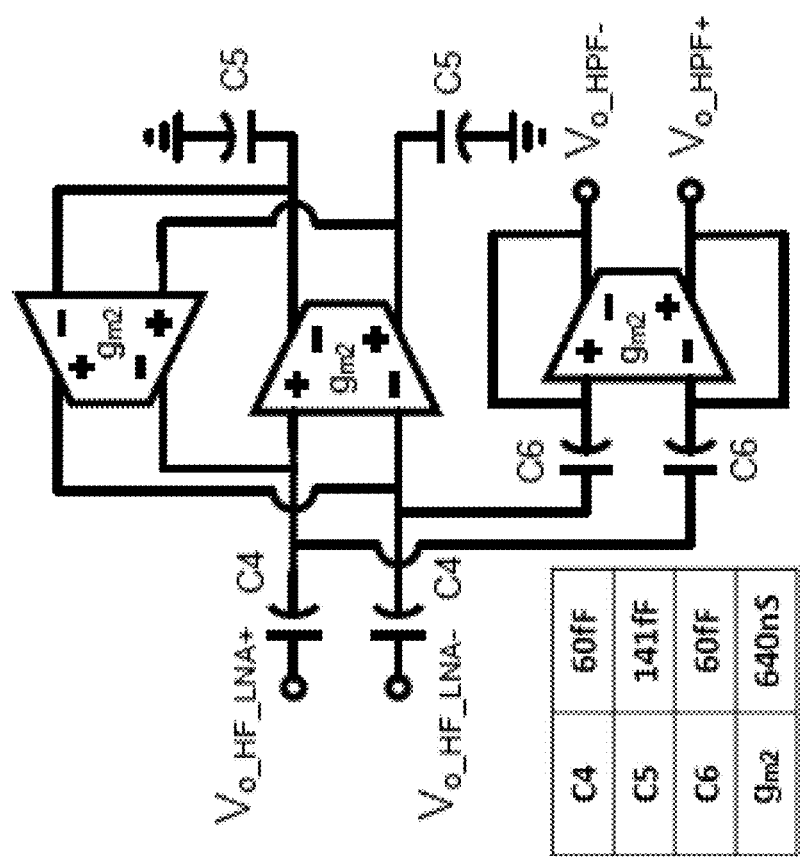
FIG. 26 is an example of a high-pass filter in accordance with some embodiments.

As shown in FIG. 26, HPF 2324 can be implemented as a third-order, 1 MHz, Chebyshev $g_m$-C high-pass filter in some embodiments. In some embodiments, this filter can be used in the HF path to reject any down-converted AM interferer in the baseband. MOS-capacitors can be used to implement C4, C5 and C6 with low capacitance values in some embodiments.

In some embodiments, Barker codes have correlations very close to a δ function. In some embodiments, the auto-correlation is 11 when the codes are aligned and reduces to ≤|1| at any other bit offset. Hence, the Barker code can be used to help to identify a wanted signal in the presence of an interferer. In some embodiments, the receiver demodulator can uses a correlation threshold of 7 to identify the wanted signal.

Figure 27:
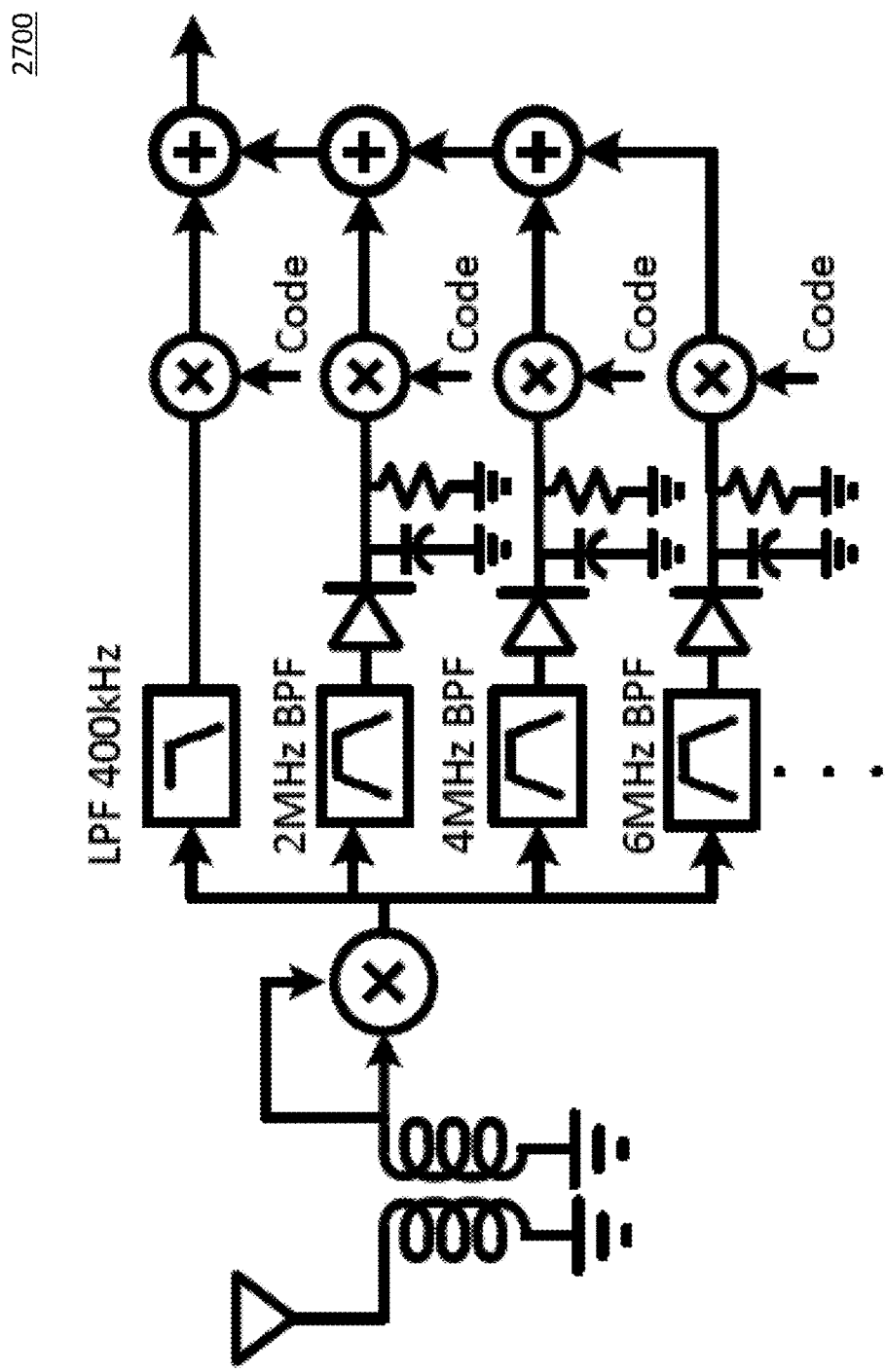
FIG. 27 is an example of an architecture for a wake-up receive that can account for multiple interferers in accordance with some embodiments.

In some embodiments, multiple interferers can be accounted for using example architecture 2700 shown in FIG. 27. Architecture 2700 uses multiple IF filters with a 400 kHz bandwidth located at different IF-frequencies, followed by a correlator-bank to look for the availability of the wanted signal in some embodiments.

Although the invention has been described and illustrated in the foregoing illustrative embodiments, it is understood that the present disclosure has been made only by way of example, and that numerous changes in the details of embodiment of the invention can be made without departing from the spirit and scope of the invention, which is limited only by the claims that follow. Features of the disclosed embodiments can be combined and rearranged in various ways.

What is claimed is:

1. A receiver comprising:
   a self-mixer including a plurality of inputs and an output;
   a matched filter having an input and an output, wherein the input of the matched filter is coupled to the output of the self-mixer;
   and
   a charge pump having an input coupled to the output of the matched filter and having an output coupled to a first input of the plurality of inputs of the self-mixer, wherein the self-mixer comprises:
   a first Negative-Channel Metal-Oxide-Semiconductor (NMOS) transistor having a source, a drain, and a gate, wherein the drain of the first NMOS transistor is coupled to the output of the self mixer;
   a second NMOS transistor having a source, a drain, and a gate, wherein the drain of the second NMOS transistor is connected to the source of the first NMOS transistor;
   a third NMOS transistor having a source, a drain, and a gate, wherein the drain of the third NMOS transistor is connected to the source of the second NMOS transistor and wherein the gate of the third NMOS transistor is connected to the gate of the first NMOS transistor;
   a fourth NMOS transistor having a source, a drain, and a gate, wherein the drain of the fourth NMOS transistor is connected to the source of the third NMOS transistor and wherein the gate of the fourth NMOS transistor is connected to the gate of the second NMOS transistor;
   a first capacitor having a first side and a second side, wherein the first side of the first capacitor is connected to a second input of the plurality of inputs of the self-mixer and wherein the second side of the first capacitor is connected to the source of the first NMOS transistor;
   a second capacitor having a first side and a second side, wherein the first side of the second capacitor is connected to the first side of the first capacitor and wherein the second side of the second capacitor is connected to the gate of the first NMOS transistor;
   a third capacitor having a first side and a second side, wherein the first side of the third capacitor is connected to the first side of the first capacitor and wherein the second side of the third capacitor is connected to the source of the third NMOS transistor; and
   a resistor have a first side and a second side, wherein the first side of the resistor is connected to a bias voltage and to the gate of the fourth NMOS transistor and wherein the second side of the resistor is connected to the gate of the third NMOS transistor.

2. The receiver of claim 1, wherein the matched filter comprises at least two oscillators and a phase frequency detector.

3. The receiver of claim 2, wherein the phase frequency detector has at least a first output and a second output, and wherein the charge pump comprises a first current source that is responsive to the first output of the phase frequency detector and a second current source that is responsive to the second output of the phase frequency detector.

4. The receiver of claim 2, wherein the phase frequency detector has at least a first output and a second output, further comprising a comparator having at least a first input connected to the first output of the phase frequency detector and a second input connected to the second output of the phase frequency detector.

5. The receiver of claim 4, wherein the comparator has an output, further comprising a correlator having an input connected to the output of the comparator.

6. The receiver of claim 1, further comprising an amplifier having an input connected to the output of self-mixer and an output connected to the input of the matched filter.

7. The receiver of claim 1, further comprising a matching network having an output connected to the second input of the plurality of inputs of the self-mixer.

8. The receiver of claim 1, wherein the self-mixer includes a plurality of stages.

9. A receiver comprising:
a self-mixer including a plurality of inputs and an output;
a matched filter having an input and an output, wherein the input of the matched filter is coupled to the output of the self-mixer;
and
a charge pump having an input coupled to the output of the matched filter and having an output coupled to a first input of the plurality of inputs of the self-mixer, wherein the matched filter comprises at least two oscillators and a phase frequency detector, and
wherein the phase frequency detector has at least a first output and a second output, and wherein the charge pump comprises a first current source that is responsive to the first output of the phase frequency detector and a second current source that is responsive to the second output of the phase frequency detector.

10. The receiver of claim 9, wherein the self-mixer comprises:
a first Negative-Channel Metal-Oxide-Semiconductor (NMOS) transistor having a source, a drain, and a gate;
a second NMOS transistor having a source, a drain, and a gate, wherein the drain of the second NMOS transistor is connected to the drain of the first NMOS transistor;
a first Positive-Channel Metal-Oxide-Semiconductor (PMOS) transistor having a source, a drain, and a gate, wherein the source of the first PMOS transistor is connected to the source of the first NMOS transistor;
a second PMOS transistor having a source, a drain, and a gate, wherein the drain of the second PMOS transistor is connected to the drain of the first PMOS transistor, and the source of the second PMOS transistor is connected to the source of the second NMOS transistor;
a first resistor having a first side connected to the gate of the first NMOS transistor and having a second side connected to a first gate bias voltage;
a second resistor having a first side connected to the gate of the first PMOS transistor and having a second side connected to a second gate bias voltage;
a third resistor having a first side connected to the gate of the second NMOS transistor and having a second side connected to the first gate bias voltage;
a fourth resistor having a first side connected to the gate of the second PMOS transistor and having a second side connected to the second gate bias voltage;
a first coupling capacitor having a first side connected to the first input of the plurality of inputs of the self-mixer and having a second side connected to the gate of the first NMOS transistor;
a second coupling capacitor having a first side connected to the first input of the plurality of inputs of the self-mixer and having a second side connected to the gate of the first PMOS transistor;
a third coupling capacitor having a first side connected to a second input of the plurality of inputs of the self-mixer and having a second side connected to the gate of the second NMOS transistor; and
a fourth coupling capacitor having a first side connected to the second input of the plurality of inputs of the self-mixer and having a second side connected to the gate of the second PMOS transistor.

11. The receiver of claim 9, wherein the self-mixer comprises:
a first Negative-Channel Metal-Oxide-Semiconductor (NMOS) transistor having a source, a drain, and a gate, wherein the drain of the first NMOS transistor is coupled to the output of the self mixer;
a second NMOS transistor having a source, a drain, and a gate, wherein the drain of the second NMOS transistor is connected to the source of the first NMOS transistor;
a third NMOS transistor having a source, a drain, and a gate, wherein the drain of the third NMOS transistor is connected to the source of the second NMOS transistor and wherein the gate of the third NMOS transistor is connected to the gate of the first NMOS transistor;
a fourth NMOS transistor having a source, a drain, and a gate, wherein the drain of the fourth NMOS transistor is connected to the source of the third NMOS transistor and wherein the gate of the fourth NMOS transistor is connected to the gate of the second NMOS transistor;
a first capacitor having a first side and a second side, wherein the first side of the first capacitor is connected to a second input of the plurality of inputs of the self-mixer and wherein the second side of the first capacitor is connected to the source of the first NMOS transistor;
a second capacitor having a first side and a second side, wherein the first side of the second capacitor is connected to the first side of the first capacitor and wherein the second side of the second capacitor is connected to the gate of the first NMOS transistor;
a third capacitor having a first side and a second side, wherein the first side of the third capacitor is connected to the first side of the first capacitor and wherein the second side of the third capacitor is connected to the source of the third NMOS transistor; and
a resistor have a first side and a second side, wherein the first side of the resistor is connected to a bias voltage and to the gate of the fourth NMOS transistor and wherein the second side of the resistor is connected to the gate of the third NMOS transistor.

12. The receiver of claim 9, further comprising an amplifier having an input connected to the output of self-mixer and an output connected to the input of the matched filter.

13. The receiver of claim 9, further comprising a matching network having an output connected to a second input of the plurality of inputs of the self-mixer.

14. The receiver of claim 9, wherein the self-mixer includes a plurality of stages.

15. A receiver comprising:
a self-mixer including a plurality of inputs and an output;
a matched filter having an input and an output, wherein the input of the matched filter is coupled to the output of the self-mixer; and
a charge pump having an input coupled to the output of the matched filter and having an output coupled to a first input of the plurality of inputs of the self-mixer, wherein the matched filter comprises at least two oscillators and a phase frequency detector, and
wherein the phase frequency detector has at least a first output and a second output, further comprising a comparator having at least a first input connected to the first output of the phase frequency detector and a second input connected to the second output of the phase frequency detector.

16. The receiver of claim 15, wherein the comparator has an output, further comprising a correlator having an input connected to the output of the comparator.

17. The receiver of claim 15, wherein the self-mixer comprises:
a first Negative-Channel Metal-Oxide-Semiconductor (NMOS) transistor having a source, a drain, and a gate;
a second NMOS transistor having a source, a drain, and a gate, wherein the drain of the second NMOS transistor is connected to the drain of the first NMOS transistor;
a first Positive-Channel Metal-Oxide-Semiconductor (PMOS) transistor having a source, a drain, and a gate, wherein the source of the first PMOS transistor is connected to the source of the first NMOS transistor;
a second PMOS transistor having a source, a drain, and a gate, wherein the drain of the second PMOS transistor is connected to the drain of the first PMOS transistor, and the source of the second PMOS transistor is connected to the source of the second NMOS transistor;
a first resistor having a first side connected to the gate of the first NMOS transistor and having a second side connected to a first gate bias voltage;
a second resistor having a first side connected to the gate of the first PMOS transistor and having a second side connected to a second gate bias voltage;
a third resistor having a first side connected to the gate of the second NMOS transistor and having a second side connected to the first gate bias voltage;
a fourth resistor having a first side connected to the gate of the second PMOS transistor and having a second side connected to the second gate bias voltage;
a first coupling capacitor having a first side connected to the first input of the plurality of inputs of the self-mixer and having a second side connected to the gate of the first NMOS transistor;
a second coupling capacitor having a first side connected to the first input of the plurality of inputs of the self-mixer and having a second side connected to the gate of the first PMOS transistor;
a third coupling capacitor having a first side connected to a second input of the plurality of inputs of the self-mixer and having a second side connected to the gate of the second NMOS transistor; and
a fourth coupling capacitor having a first side connected to the second input of the plurality of inputs of the self-mixer and having a second side connected to the gate of the second PMOS transistor.

18. The receiver of claim 15, wherein the self-mixer comprises:
a first Negative-Channel Metal-Oxide-Semiconductor (NMOS) transistor having a source, a drain, and a gate, wherein the drain of the first NMOS transistor is coupled to the output of the self mixer;
a second NMOS transistor having a source, a drain, and a gate, wherein the drain of the second NMOS transistor is connected to the source of the first NMOS transistor;
a third NMOS transistor having a source, a drain, and a gate, wherein the drain of the third NMOS transistor is connected to the source of the second NMOS transistor and wherein the gate of the third NMOS transistor is connected to the gate of the first NMOS transistor;
a fourth NMOS transistor having a source, a drain, and a gate, wherein the drain of the fourth NMOS transistor is connected to the source of the third NMOS transistor and wherein the gate of the fourth NMOS transistor is connected to the gate of the second NMOS transistor;
a first capacitor having a first side and a second side, wherein the first side of the first capacitor is connected to a second input of the plurality of inputs of the self-mixer and wherein the second side of the first capacitor is connected to the source of the first NMOS transistor;
a second capacitor having a first side and a second side, wherein the first side of the second capacitor is connected to the first side of the first capacitor and wherein the second side of the second capacitor is connected to the gate of the first NMOS transistor;
a third capacitor having a first side and a second side, wherein the first side of the third capacitor is connected to the first side of the first capacitor and wherein the second side of the third capacitor is connected to the source of the third NMOS transistor; and
a resistor have a first side and a second side, wherein the first side of the resistor is connected to a bias voltage and to the gate of the fourth NMOS transistor and wherein the second side of the resistor is connected to the gate of the third NMOS transistor.

19. The receiver of claim 15, further comprising an amplifier having an input connected to the output of self-mixer and an output connected to the input of the matched filter.

20. The receiver of claim 15, further comprising a matching network having an output connected to a second input of the plurality of inputs of the self-mixer.

21. The receiver of claim 15, wherein the self-mixer includes a plurality of stages.

* * * * *